(12) United States Patent
Nishimura

(10) Patent No.: US 7,994,585 B2
(45) Date of Patent: Aug. 9, 2011

(54) SEMICONDUCTOR DEVICE AND METHOD FOR MANUFACTURING THE SAME

(75) Inventor: Isamu Nishimura, Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 189 days.

(21) Appl. No.: 12/318,861

(22) Filed: Jan. 9, 2009

(65) Prior Publication Data

US 2009/0179277 A1 Jul. 16, 2009

(30) Foreign Application Priority Data

Jan. 11, 2008 (JP) ................................. 2008-004606

(51) Int. Cl.
*H01L 21/70* (2006.01)

(52) U.S. Cl. ........... 257/369; 257/E21.64; 257/E27.062; 438/199

(58) Field of Classification Search ................. 257/213, 257/288, 368, 369, E21.615, E21.616, E21.632, 257/E21.64, E27.046, E27.059, E27.06, E27.062; 438/142, 197, 199
See application file for complete search history.

(56) References Cited

U.S. PATENT DOCUMENTS

| | | | |
|---|---|---|---|
| 2005/0116360 A1* | 6/2005 | Huang et al. | 257/900 |
| 2006/0001104 A1 | 1/2006 | Ookura | |
| 2006/0118892 A1* | 6/2006 | Wu et al. | 257/412 |
| 2006/0189056 A1* | 8/2006 | Ko et al. | 438/197 |

FOREIGN PATENT DOCUMENTS

JP 2006-019327 1/2006

* cited by examiner

*Primary Examiner* — Minh-Loan T Tran
*Assistant Examiner* — Kevin Quinto
(74) *Attorney, Agent, or Firm* — Rabin & Berdo, PC

(57) ABSTRACT

A semiconductor device according to the present invention includes: a semiconductor layer; an element separating portion, formed in a top layer portion of the semiconductor layer and separating, in the semiconductor layer, a first element forming region for forming a first conductive type MOSFET and a second element forming region for forming a second conductive type MOSFET; a first gate insulating film, selectively formed on a top surface of the semiconductor layer in the first element forming region; a first gate electrode, formed on the first gate insulating film; a first sidewall, formed at a periphery of the first gate insulating film and the first gate electrode; a second gate insulating film, selectively formed on a top surface of the semiconductor layer in the second element forming region; a second gate electrode, formed on the second gate insulating film; and a second sidewall, formed at a periphery of the second gate insulating film and the second gate electrode. The first sidewall includes: a base, contacting the top surface of the semiconductor layer; and a main body, formed on the base and protruding laterally beyond a peripheral edge of the base.

18 Claims, 21 Drawing Sheets

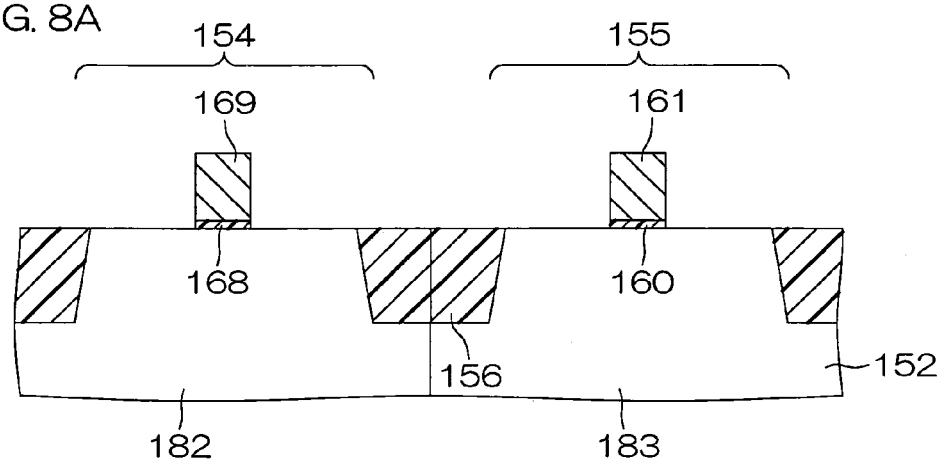
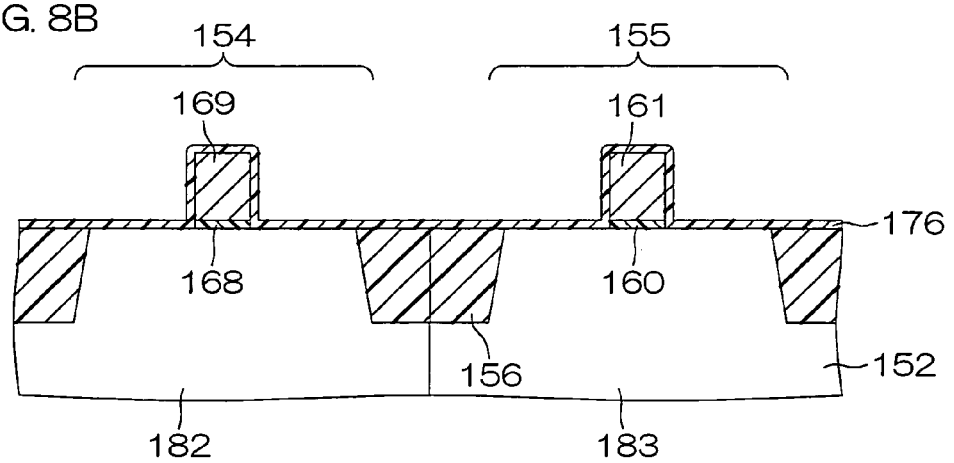
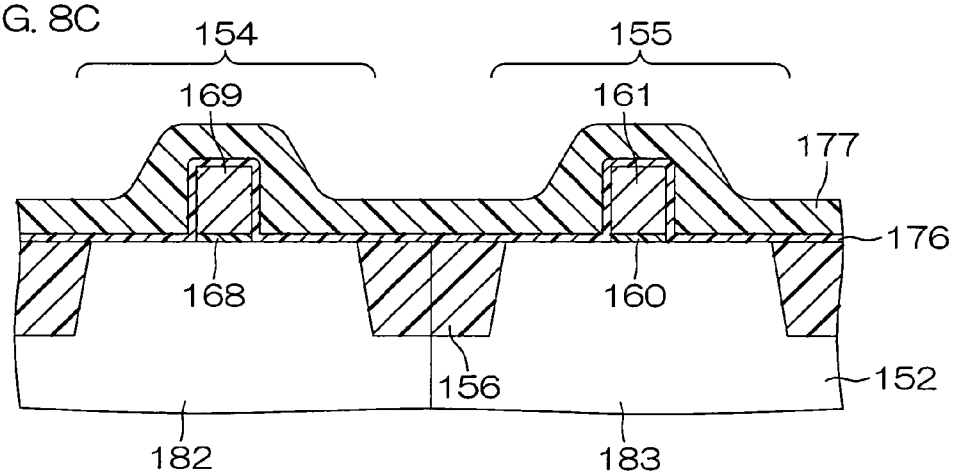

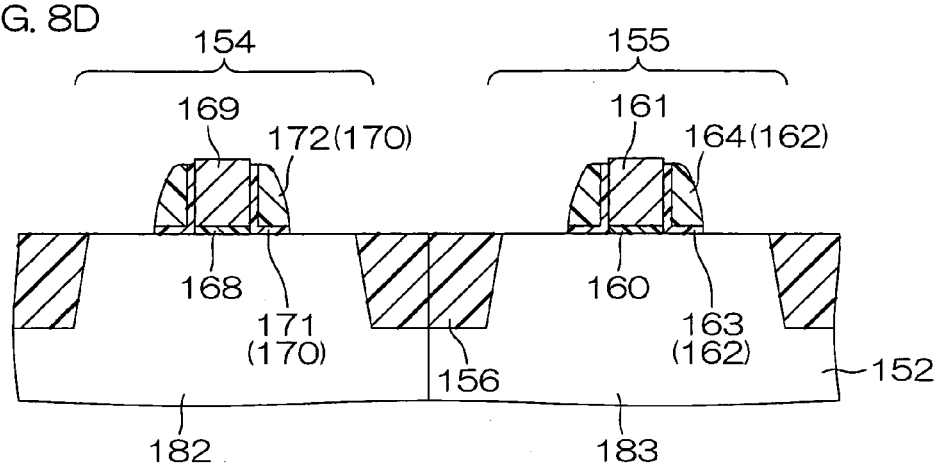
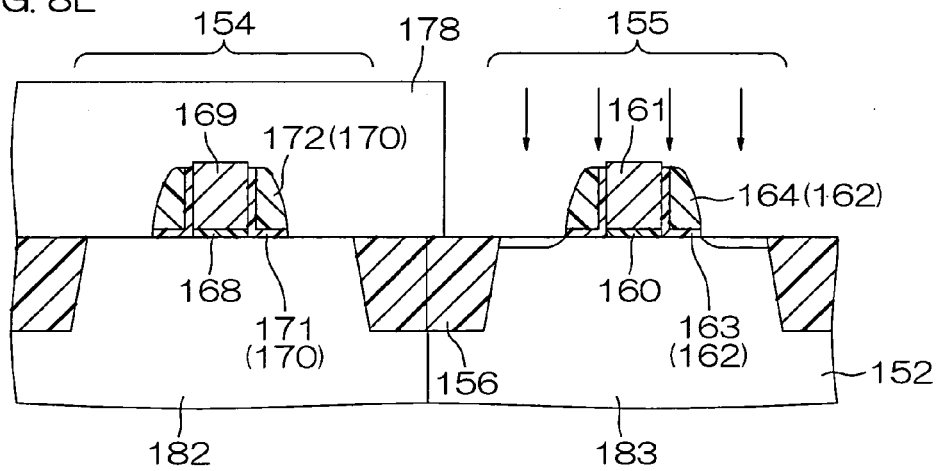
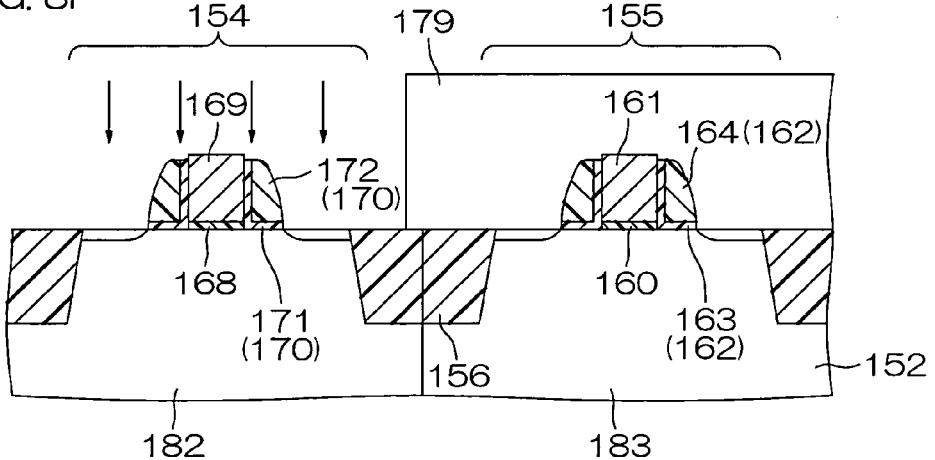

SEMICONDUCTOR DEVICE AND METHOD FOR MANUFACTURING THE SAME

BACKGROUND OF THE INVENTION

1. Field of the Invention

The present invention relates to a semiconductor device, having a CMOS (Complementary Metal Oxide Semiconductor) structure, and a method for manufacturing the same.

2. Description of Related Art

A structure, having a MOSFET (Metal Oxide Semiconductor Field Effect Transistor) formed on a semiconductor substrate and having a so-called high stress nitride film formed on the semiconductor substrate to apply stress to a channel region of the MOSFET, has been known from before. An ON current of the MOSFET can be increased by this structure.

An NMOSFET (N channel MOSFET) and a PMOSFET (P channel MOSFET) differ in the type of stress to be applied to the channel region to increase the ON current. That is, with an NMOSFET, the ON current can be increased by applying a tensile stress to the channel region and thereby improving an electron mobility in the channel region. Meanwhile with a PMOSFET, the ON current can be increased by applying a compressive stress to the channel region and thereby improving a hole mobility in the channel region.

When in a chip on which a CMOS circuit is mounted, a high stress nitride film for applying a tensile stress to a channel region (hereinafter referred to as a "tensile stress film") is formed on a semiconductor substrate, a tensile stress can be applied to the channel region of an NMOSFET. Consequently, the ON current of the NMOSFET can be increased. However, because a tensile stress is also applied to the channel region of a PMOSFET, the hole mobility decreases in the PMOSFET channel region and the ON current of the PMOSFET decreases. Oppositely, when a high stress nitride film for applying a compressive stress to a channel region (hereinafter referred to as a "compressive stress film") is formed on a semiconductor substrate, a compressive stress can be applied to the channel region of the PMOSFET. Consequently, the ON current of the PMOSFET can be increased. However, because a compressive stress is also applied to the channel region of the NMOSFET, the ON current of the NMOSFET decreases.

Thus, in a case where an NMOSFET and a PMOSFET are mixedly mounted on a semiconductor substrate, for example, forming of a tensile stress film on the semiconductor substrate followed by selective removal of the tensile stress film from a region in which the PMOSFET is formed and leaving of the tensile stress film on a region in which the NMOSFET is formed may be considered. Because the tensile stress can thereby be applied only to the channel region of the NMOSFET, the ON current of the NMOSFET can be increased while preventing decrease in the ON current of the PMOSFET. Further, forming of a compressive stress film on the semiconductor substrate followed by selective removal of the compressive stress film from the region in which the NMOSFET is formed and leaving of the compressive stress film on the region in which the PMOSFET is formed may be considered. Because the compressive stress can thereby be applied only to the channel region of the PMOSFET, the ON current of the PMOSFET can be increased while preventing decrease in the ON current of the NMOSFET.

A high stress nitride film is used as an etching stopper film in an etching step for forming a contact hole in an interlayer insulating film laminated on a semiconductor substrate (on the high stress nitride film). Thus, when a high stress nitride film is selectively removed, a low stress nitride film must be selectively formed anew as an etching stopper film in the film-removed region. Selective formation of the low stress nitride film is accomplished, for example, by forming the low stress nitride film on an entirety of the semiconductor substrate and employing photolithography or etching to selectively remove the low stress nitride film from regions where a tensile stress film or a compressive stress film remains. However, such selective removal of the high stress nitride film and selective formation of the low stress film leads to a significant increase in a number of manufacturing steps.

SUMMARY OF THE INVENTION

An object of the present invention is to provide a semiconductor device, with which stresses suited to P and/or N MOSFET channel regions can be applied without causing a significant increase in a number of manufacturing steps, and a method for manufacturing the same.

A semiconductor device according to one aspect of the present invention includes: a semiconductor layer; an element separating portion, formed in a top layer portion of the semiconductor layer and separating, in the semiconductor layer, a first element forming region for forming a first conductive type MOSFET and a second element forming region for forming a second conductive type MOSFET; a first gate insulating film, selectively formed on a top surface of the semiconductor layer in the first element forming region; a first gate electrode, formed on the first gate insulating film; a first sidewall, formed at a periphery of the first gate insulating film and the first gate electrode; a second gate insulating film, selectively formed on the top surface of the semiconductor layer in the second element forming region; a second gate electrode, formed on the second gate insulating film; and a second sidewall, formed at a periphery of the second gate insulating film and the second gate electrode; and the first sidewall includes: a base, contacting the top surface of the semiconductor layer; and a main body, formed on the base and protruding laterally beyond a peripheral edge of the base.

With this configuration, the element separating portion, separating the first element forming region for forming the first conductive type MOSFET and the second element forming region for forming the second conductive type MOSFET, is formed in the top layer portion of the semiconductor layer. The first gate insulating film is selectively formed on the top surface of the semiconductor layer in the first element forming region. The first gate electrode is formed on the first gate insulating film. The first sidewall is formed at the periphery of the first gate insulating film and the first gate electrode. The second gate insulating film is selectively formed on the top surface of the semiconductor layer in the second element forming region. The second gate electrode is formed on the second gate insulating film. The second sidewall is formed at the periphery of the second gate insulating film and the second gate electrode. The first sidewall includes the base, contacting the top surface of the semiconductor layer, and the main body, formed on the base and protruding laterally beyond the peripheral edge of the base.

Because the main body of the first sidewall protrudes laterally beyond the peripheral edge of the base, even if a high stress nitride film, in which is accumulated a stress in a direction of increasing an ON current of the second conductive type MOSFET, is formed on the semiconductor layer, the first gate electrode, and the second gate electrode, the high stress nitride film is interrupted at a portion opposing the base of the first sidewall or is made a thin film at that portion. An adequate stress in the direction of increasing the ON current of the second conductive type MOSFET can thus be applied to a channel region in a top layer portion of the semiconductor layer opposing the second gate insulating film without applying a large stress in a direction of decreasing an ON current of the first conductive type MOSFET to a channel region in a top layer portion of the semiconductor layer opposing the first gate insulating film. A stress suited to the channel region of the second conductive type MOSFET can thus be applied without having to selectively remove the high stress nitride film from the first element forming region or selectively form a low stress nitride film in the first element forming region after the removal. The stress suited to the channel region of the second conductive type MOSFET can thus be applied without causing a significant increase in a number of manufacturing steps.

The first conductive type may be a P-type and the second conductive type may be an N-type. In this case, a tensile stress is preferably applied to the channel region in the top layer portion of the semiconductor layer opposing the second gate insulating film. That is, a tensile stress is preferably applied to the channel region of an NMOSFET. The ON current of the NMOSFET can thereby be increased.

Further in this case, a tensile stress film for applying the tensile stress to the channel region in the top layer portion of the semiconductor layer opposing the second gate insulating film may be disposed on the semiconductor layer, the first gate electrode, and the second gate electrode.

The semiconductor device having the configuration including the tensile stress film can be manufactured by a manufacturing method including the following steps 1 to 7:

1. a step of forming a first gate insulating film and a first gate electrode, laminated on the first gate insulating film, on a top surface of a semiconductor layer in a first element forming region in which the PMOSFET is to be formed;

2. a step of forming a second gate insulating film and a second gate electrode, laminated on the second gate insulating film, on a top surface of the semiconductor layer in a second element forming region in which the NMOSFET is to be formed;

3. a step of forming an oxide film on the semiconductor layer, the first gate electrode, and the second gate electrode;

4. a step of forming a nitride film on the oxide film;

5. a step of etching back the oxide film and the nitride film to form a first sidewall, including a base made of the oxide film and a main body made of the nitride film, at a periphery of the first gate insulating film and the first gate electrode and form a second sidewall, including a base made of the oxide film and a main body made of the nitride film, at a periphery of the second gate insulating film and the second gate electrode;

6. a step of etching the base of the first sidewall to form the first sidewall to a shape where a peripheral edge of the main body protrudes laterally beyond a peripheral edge of the base of the first sidewall; and 7. a step of forming, on the semiconductor layer, the first gate electrode, and the second gate electrode, a tensile stress film for applying a tensile stress to a channel region in a top layer portion of the semiconductor layer opposing the second gate insulating film.

The tensile stress film for applying the tensile stress to the channel region in the top layer portion of the semiconductor layer opposing the second gate insulating film is formed on the semiconductor layer, the first gate electrode, and the second gate electrode after the peripheral edge of the main body of the first sidewall has been formed to the shape of protruding laterally beyond the base of the first sidewall by the etching of the base of the first sidewall. The tensile stress film is thereby interrupted at a portion opposing the base of the first sidewall or is made a thin film at that portion. An adequate tensile stress in a direction of increasing an ON current of the NMOSFET can thus be applied to the channel region in the top layer portion of the semiconductor layer opposing the second gate insulating film without applying a large tensile stress in a direction of decreasing an ON current of the PMOSFET to a channel region in a top layer portion of the semiconductor layer opposing the first gate insulating film. Consequently, a semiconductor device can be obtained with which the tensile stress can be applied to the channel region of the NMOSFET without causing a significant increase in the number of manufacturing steps.

The manufacturing method may further include a step of performing a heat treatment after the step of forming the tensile stress film.

By performing the heat treatment after the step of forming the tensile stress film, the channel region in the top layer portion of the semiconductor layer opposing the second gate insulating film can be made to memorize the tensile stress. By making the channel region of the NMOSFET memorize the tensile stress, a state where the tensile stress remains applied to the channel region of the NMOSFET can be maintained even when the tensile stress film is removed thereafter.

The first conductive type may be an N-type and the second conductive type may be a P-type. In this case, a compressive stress is preferably applied to the channel region in the top layer portion of the semiconductor layer opposing the second gate insulating film. That is, a compressive stress is preferably applied to the channel region of the PMOSFET. The ON current of the PMOSFET can thereby be increased.

Further, a tensile stress may be applied to the channel region in the top layer portion of the semiconductor layer opposing the first gate insulating film. That is, a tensile stress may be applied to the channel region of the NMOSFET with a compressive stress being applied to the channel region of the PMOSFET. The ON current of the NMOSFET can thereby be increased while enabling the ON current of the PMOSFET to be increased.

Still further, a compressive stress film for applying a compressive stress to the channel region in the top layer portion of the semiconductor layer opposing the second gate insulating film may be disposed on the semiconductor layer, the first gate electrode, and the second gate electrode.

The semiconductor device having the configuration including the compressive stress film can be manufactured by a manufacturing method including the following steps 1 to 7:

1. a step of forming a first gate insulating film and a first gate electrode, laminated on the first gate insulating film, on a top surface of a semiconductor layer in a first element forming region in which the NMOSFET is to be formed;

2. a step of forming a second gate insulating film and a second gate electrode, laminated on the second gate insulating film, on the top surface of the semiconductor layer in a first element forming region in which the PMOSFET is to be formed;

3. a step of forming an oxide film on the semiconductor layer, the first gate electrode, and the second gate electrode;

4. a step of forming a nitride film on the oxide film;

5. a step of etching back the oxide film and the nitride film to form a first sidewall, including a base made of the oxide film and a main body made of the nitride film, at a periphery of the first gate insulating film and the first gate electrode and form a second sidewall, including a base made of the oxide film and a main body made of the nitride film, at a periphery of the second gate insulating film and the second gate electrode;

6. a step of etching the base of the first sidewall to form the first sidewall to a shape where a peripheral edge of the main body protrudes laterally beyond a peripheral edge of the base of the first sidewall; and 7. a step of forming, on the semiconductor layer, the first gate electrode, and the second gate electrode, a compressive stress film for applying a compressive stress to a channel region in a top layer portion of the semiconductor layer opposing the second gate insulating film.

The compressive stress film for applying the compressive stress to the channel region in the top layer portion of the semiconductor layer opposing the second gate insulating film is formed on the semiconductor layer, the first gate electrode, and the second gate electrode after the peripheral edge of the main body of the first sidewall has been formed to the shape of protruding laterally beyond the base of the first sidewall by the etching of the base of the first sidewall. The compressive stress film is thereby interrupted at a portion opposing the base of the first sidewall or is made a thin film at that portion. An adequate compressive stress in a direction of increasing an ON current of the PMOSFET can thus be applied to the channel region in the top layer portion of the semiconductor layer opposing the second gate insulating film without applying a large compressive stress in a direction of decreasing an ON current of the NMOSFET to a channel region in a top layer portion of the semiconductor layer opposing the first gate insulating film. Consequently, a semiconductor device can be obtained with which the compressive stress can be applied to the channel region of the PMOSFET without causing a significant increase in the number of manufacturing steps.

The foregoing and other objects, features, and effects of the present invention will become more apparent from the following detailed description of the embodiments with reference to the attached drawings.

BRIEF DESCRIPTION OF THE DRAWINGS

FIG. 8A is a schematic sectional view for describing a method for manufacturing the semiconductor device of FIG. 7.

FIG. 8B is a schematic sectional view of a step subsequent to that of FIG. 8A.

FIG. 8C is a schematic sectional view of a step subsequent to that of FIG. 8B.

FIG. 8D is a schematic sectional view of a step subsequent to that of FIG. 8C.

FIG. 8E is a schematic sectional view of a step subsequent to that of FIG. 8D.

FIG. 8F is a schematic sectional view of a step subsequent to that of FIG. 8E.

DETAILED DESCRIPTION OF PREFERRED EMBODIMENTS

Embodiments of the present invention shall now be described in detail with reference to the attached drawings.

Figure 1:
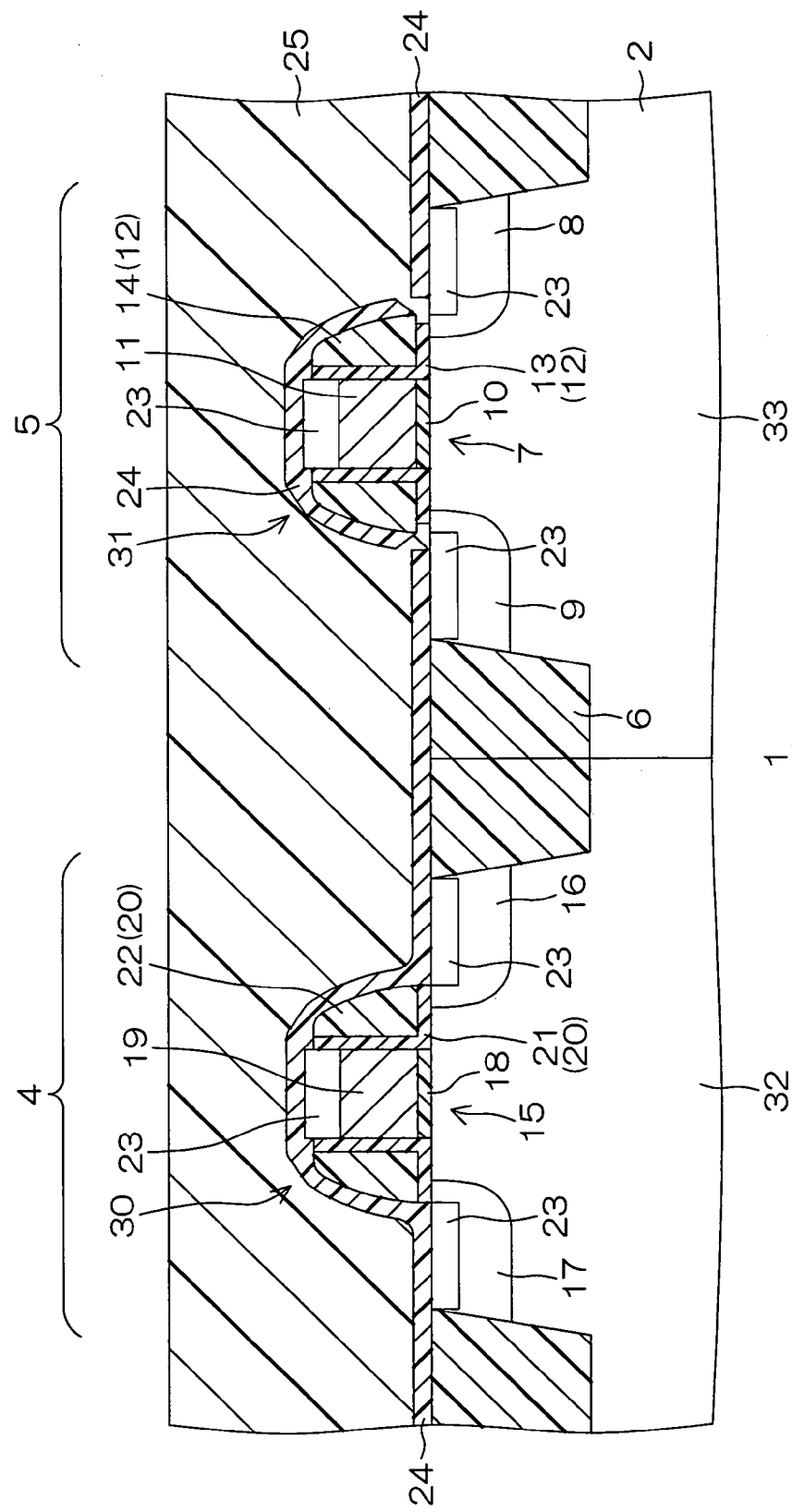
FIG. 1 is a schematic sectional view of a structure of a semiconductor device according to a first embodiment of the present invention.

FIG. 1 is a schematic sectional view of a structure of a semiconductor device according to a first embodiment of the present invention.

The semiconductor device 1 has a CMOS structure including a planar NMOSFET 30 and PMOSFET 31.

In the semiconductor device 1, a P$^-$-type semiconductor layer 2 is laminated on an unillustrated semiconductor substrate.

An element separating portion 6 is formed in a top layer portion of the semiconductor layer 2. The element separating portion 6 rectangularly surrounds an NMOSFET forming region 4 in which the NMOSFET 30 is formed and a PMOSFET forming region 5 in which the PMOSFET 31 is formed. The element separating portion 6 has a structure where SiO$_2$ (silicon oxide) or other insulator is embedded in grooves dug in comparatively shallowly from a top surface of the semiconductor layer 2 (for example, shallow trenches of 0.2 to 0.5 µm depth). The NMOSFET forming region 4 and the PMOSFET forming region 5 are insulatingly separated by the element separating portion 6.

An N well 33 is formed in a top layer portion of the semiconductor layer 2 in the PMOSFET forming region 5. In a top layer portion of the N well 33 (the top layer portion of the semiconductor layer 2 in the PMOSFET forming region 5), P$^+$-type source region 8 and a drain region 9 are formed across a channel region 7.

A gate insulating film 10 is formed as a first gate insulating film made of SiO$_2$ on the channel region 7. A gate electrode 11 is formed as a first gate electrode made of polysilicon on the gate insulating film 10.

A sidewall 12 is formed as a first sidewall at a periphery of the gate electrode 11. Side surfaces of the gate insulating film 10 and the gate electrode 11 are surrounded by the sidewall 12. The sidewall 12 includes a base 13, made of SiO$_2$, and a main body 14, made of SiN (silicon nitride).

The base 13 has, for example, a film thickness of 5 to 10 nm and is formed to an L-like cross section in contact with the semiconductor layer 2, the gate insulating film 10, and the gate electrode 11.

The main body 14 is formed on the base 13, has a substantially triangular cross section, and opposes an entirety of the side surfaces of the gate electrode 11. Peripheral edges of the main body 14 protrude laterally beyond peripheral edges of the base 13.

A P well 32 is formed in a top layer portion of the semiconductor layer 2 in the NMOSFET forming region 4. In a top layer portion of the P well 32 (the top layer portion of the semiconductor layer 2 in the NMOSFET forming region 4), an N$^+$-type source region 16 and a drain region 17 are formed across a channel region 15.

A gate insulating film 18 is formed as a second gate insulating film made of SiO$_2$ on the channel region 15. A gate electrode 19 is formed as a second gate electrode made of polysilicon on the gate insulating film 18.

A sidewall 20 is formed as a second sidewall at a periphery of the gate electrode 19. Side surfaces of the gate insulating film 18 and the gate electrode 19 are surrounded by the sidewall 20. The sidewall 20 includes a base 21, made of SiO$_2$, and a main body 22, made of SiN.

The base 21 has, for example, a film thickness of 5 to 10 nm and is formed to an L-like cross section in contact with the semiconductor layer 2, the gate insulating film 18, and the gate electrode 19.

The main body 22 is formed on the base 21, has a substantially triangular cross section, and opposes an entirety of the side surfaces of the gate electrode 19. Peripheral edges of the main body 22 and peripheral edges of the base 21 are overlapped.

Co silicide 23 for electrical connection is formed in respective surface layer portions of the source regions 8 and 16, the drain regions 9 and 17, the gate electrode 11, and the gate electrode 19.

A tensile stress film 24, made of SiN and in which is accumulated a tensile stress in a direction from an outer side to an inner side thereof, is formed on the semiconductor layer 2, the gate electrode 11, and the gate electrode 19. In the NMOSFET forming region 4, the tensile stress film 24 covers the semiconductor layer 2, the gate electrode 19, and the sidewall 20 continuously. In the PMOSFET forming region, the tensile stress film 24 covers the semiconductor layer 2, the gate electrode 11, and the sidewall 12. However, due to the peripheral edges of the main body 14 of the sidewall 12 protruding laterally beyond the base 13, the tensile stress film 24 is interrupted at portions opposing the base 13 of the sidewall 12 or is thinned at these portions.

An interlayer insulating film 25 made of SiO$_2$ is formed on the tensile stress film 24.

The base 13 of the sidewall 12 of the PMOSFET 31 is thus not covered by the tensile stress film 24 or even if covered, is not covered adequately. An adequate tensile stress in a direction of increasing an ON current of the NMOSFET 30 can thus be applied by the tensile stress film 24 to the channel region 15 of the NMOSFET 30 without applying a large tensile stress in a direction of decreasing an ON current of the PMOSFET 31 to the channel region 7 of the PMOSFET 31. A tensile stress suited to the channel region 15 of the NMOSFET 30 can thus be applied without selectively removing the tensile stress film 24 from the PMOSFET forming region 5 or selectively forming a low stress nitride film on the PMOSFET forming region 5 after the removal. Consequently, the tensile stress suited to the channel region 15 of the NMOSFET 30 can be applied without causing a significant increase in a number of manufacturing steps.

FIGS. 2A to 2J are schematic sectional views illustrating, in order of process, a method for manufacturing the semiconductor device 1.

First, grooves corresponding to the element separating portion 6 are formed in a top layer portion of the semiconductor layer 2 by reactive ion etching. An SiO$_2$ film is then deposited by LPCVD (Low Pressure Chemical Vapor Deposition) on the semiconductor layer 2 to a thickness completely filling the respective grooves. Portions of the SiO$_2$ film extending outside the respective grooves are then selectively removed and by the SiO$_2$ film remaining only on the grooves, the element separating portion 6 is formed. Selective removal of the SiO$_2$ film can be achieved by CMP (Chemical Mechanical Polishing).

Figure 2A:
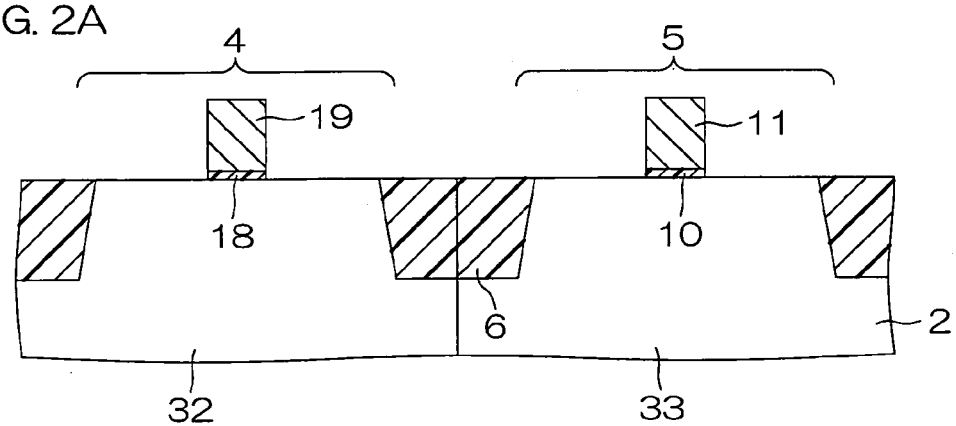
FIG. 2A is a schematic sectional view for describing a method for manufacturing the semiconductor device of FIG. 1.

Thereafter, an SiO$_2$ film is formed on the semiconductor layer 2 by a thermal oxidation method. A polysilicon layer is then formed by CVD on the SiO$_2$ film. By the SiO$_2$ film and the polysilicon film then being selectively removed by photolithography and etching, the gate insulating film 10 and the gate electrode 11 are formed in the PMOSFET forming region 5 and the gate insulating film 18 and the gate electrode 19 are formed in the NMOSFET forming region 4 as shown in FIG. 2A.

Figure 2B:
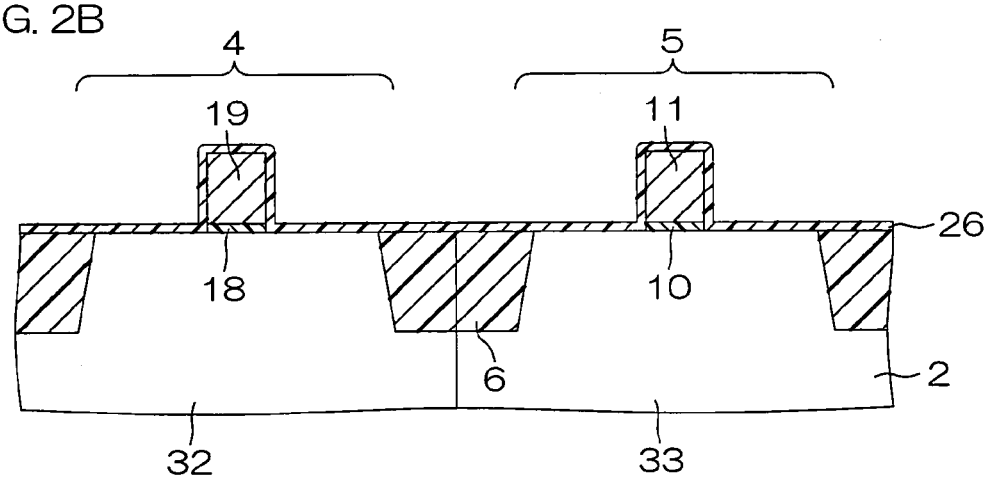
FIG. 2B is a schematic sectional view of a step subsequent to that of FIG. 2A.

Then, as shown in FIG. 2B, an oxide film 26 made of SiO$_2$ is formed by LPCVD on the semiconductor layer 2, the gate electrode 11, and the gate electrode 19.

Figure 2C:
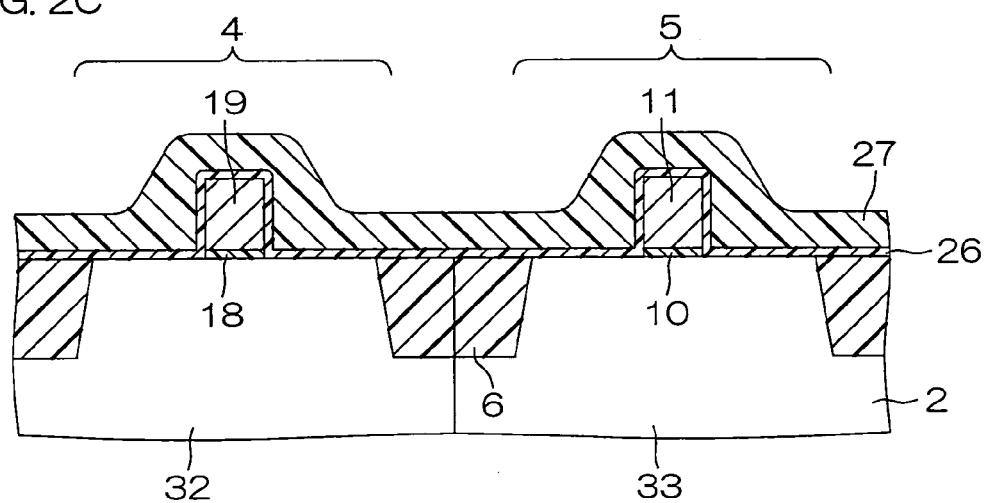
FIG. 2C is a schematic sectional view of a step subsequent to that of FIG. 2B.

Thereafter, a nitride film 27 made of SiN is formed by LPCVD on the oxide film 26 as shown in FIG. 2C.

Figure 2D:
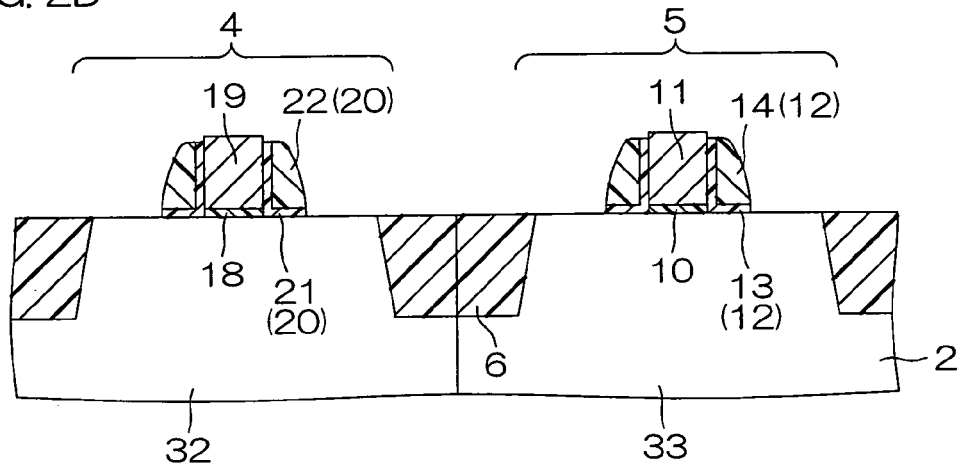
FIG. 2D is a schematic sectional view of a step subsequent to that of FIG. 2C.

Then, as shown in FIG. 2D, by the oxide film 26 and the nitride film 27 being etched back until upper surfaces of the gate electrode 11 and the gate electrode 19 are exposed, the sidewall 12 is formed at the periphery of the gate insulating film 10 and the gate electrode 11 and the sidewall 20 is formed at the periphery of the gate insulating film 18 and the gate electrode 19. At this point, the peripheral edges of the main body 14 of the sidewall 12 are overlapped with the peripheral edges of the base 13. The peripheral edges of the main body 22 of the sidewall 20 are overlapped with the peripheral edges of the base 21.

Figure 2E:
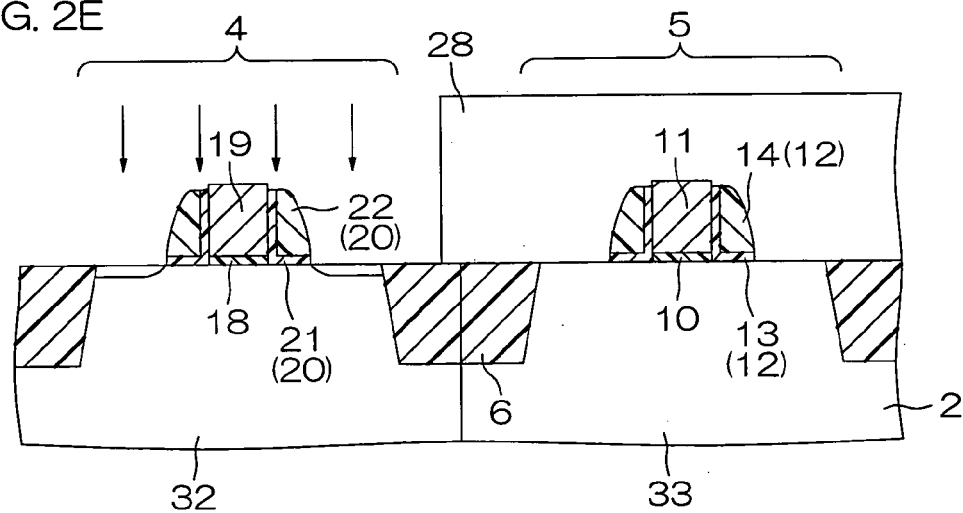
FIG. 2E is a schematic sectional view of a step subsequent to that of FIG. 2D.

Thereafter, as shown in FIG. 2E, a resist pattern 28 having an opening opposing the NMOSFET forming region 4 is formed on the semiconductor layer 2. An N-type impurity is implanted into a top layer portion of the semiconductor layer 2 via the opening of the resist pattern 28. After implantation of the N-type impurity, the resist pattern 28 is removed.

Figure 2F:
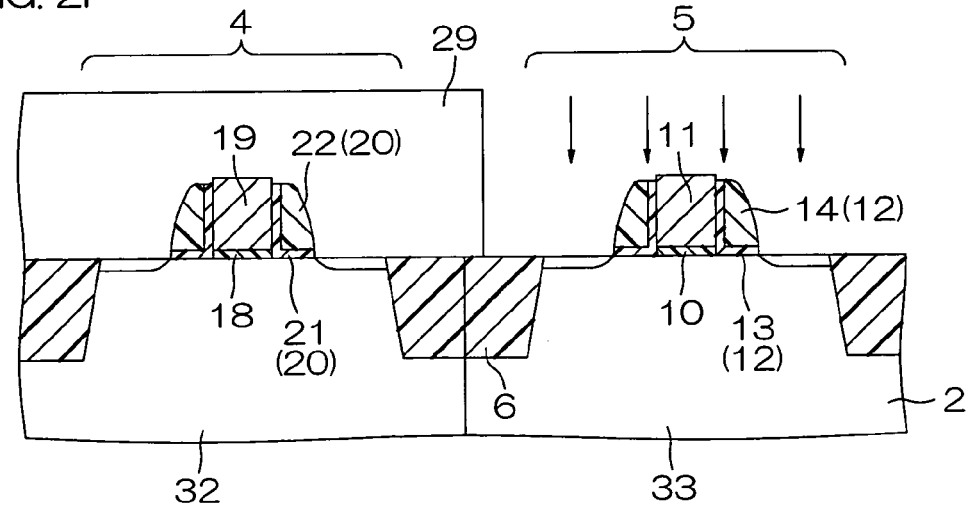
FIG. 2F is a schematic sectional view of a step subsequent to that of FIG. 2E.

Then, as shown in FIG. 2F, a resist pattern 29 having an opening opposing the PMOSFET forming region 5 is formed on the semiconductor layer 2. A P-type impurity is implanted into a top layer portion of the semiconductor layer 2 via the opening of the resist pattern 29.

Figure 2G:
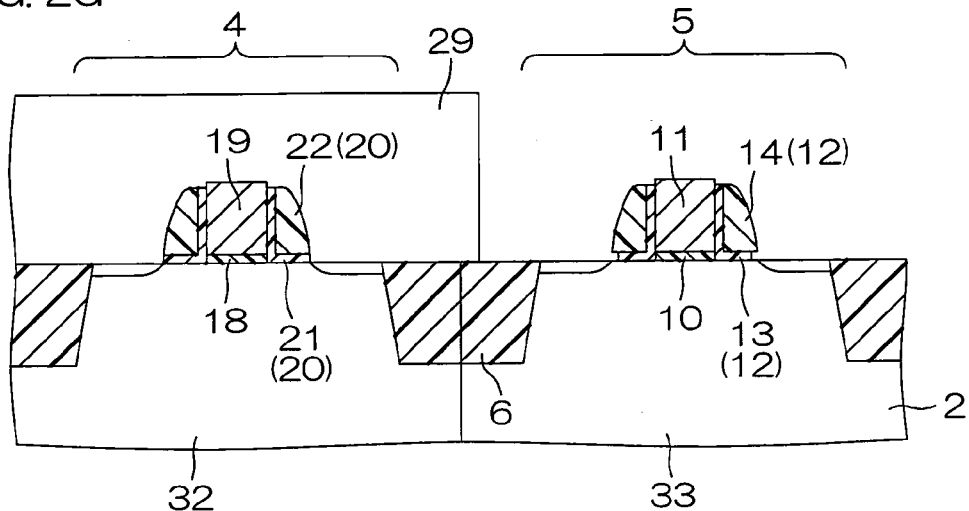
FIG. 2G is a schematic sectional view of a step subsequent to that of FIG. 2F.

Thereafter, as shown in FIG. 2G, peripheral edge portions of the base 13 of the sidewall 12 are removed by wet etching. That is, a solution capable of etching the base 13 is supplied to the base 13 via the opening of the resist pattern 29 and portions of the base 13 sandwiched by peripheral edge portions of the main body 14 and the semiconductor layer 2 are removed. Consequently, the peripheral edges of the main body 14 are shaped to protrude laterally with respect to the peripheral edges of the base 13. After the wet etching of the base 13, the resist pattern 29 is removed.

Figure 2H:
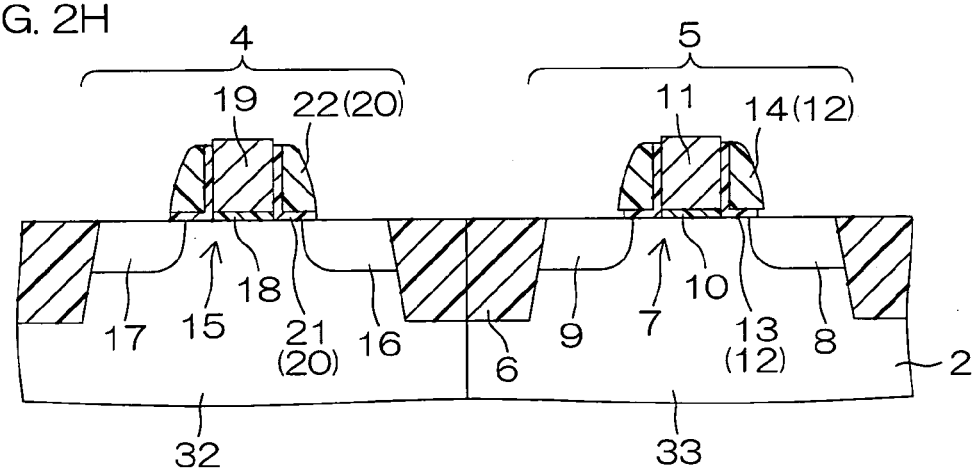
FIG. 2H is a schematic sectional view of a step subsequent to that of FIG. 2G.

An annealing treatment is then performed. The source region 8 and the drain region 9 are thereby formed in the top layer portion of the semiconductor layer 2 in the PMOSFET forming region 5 as shown in FIG. 2H. Further, the source region 16 and the drain region 17 are formed in the top layer portion of the semiconductor layer 2 in the NMOSFET forming region 4.

Figure 2I:
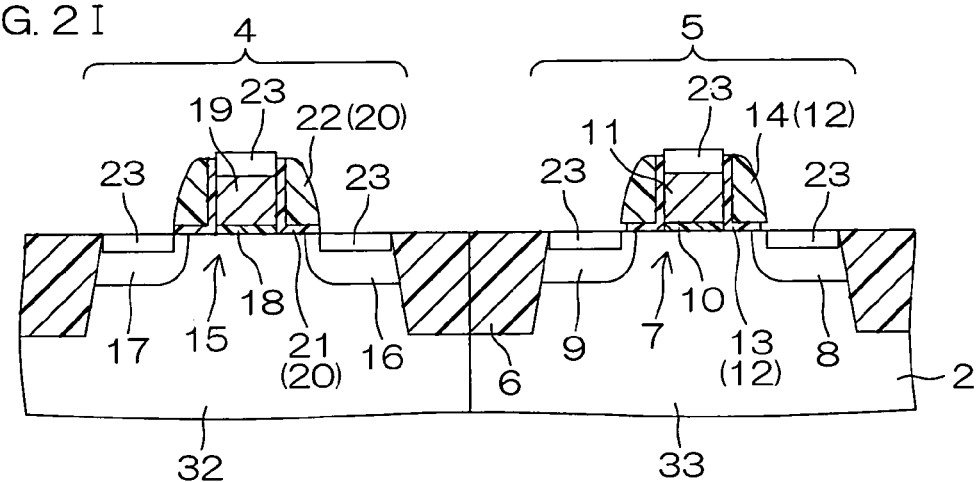
FIG. 2I is a schematic sectional view of a step subsequent to that of FIG. 2H.

Thereafter, as shown in FIG. 2I, a Co (cobalt) film (not shown) is formed by PVD (Physical Vapor Deposition) on the source regions 8 and 16, the drain regions 9 and 17, the gate electrode 11, and the gate electrode 19. By an annealing treatment being performed thereafter, the Co silicide 23 for electrical connection (contact) is formed in the respective surface layer portions of the source regions 8 and 16, the drain regions 9 and 17, the gate electrode 11, and the gate electrode 19.

Figure 2J:
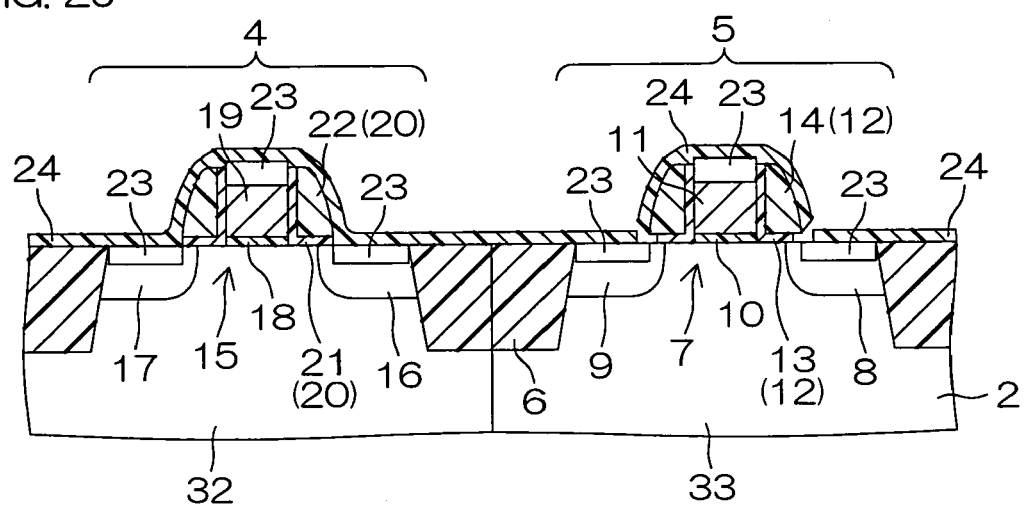
FIG. 2J is a schematic sectional view of a step subsequent to that of FIG. 2I.

Then, as shown in FIG. 2J, the tensile stress film 24 is formed by CVD on the semiconductor layer 2, the gate electrode 11, and the gate electrode 19. In the NMOSFET forming region 4, the tensile stress film 24 covers the semiconductor layer 2, the gate electrode 19, and the sidewall 20 continuously. In the PMOSFET forming region, the tensile stress film 24 covers the semiconductor layer 2, the gate electrode 11, and the sidewall 12. However, due to the peripheral edges of the main body 14 of the sidewall 12 protruding laterally beyond the base 13, the tensile stress film 24 is interrupted at the portions opposing the base 13 of the sidewall 12 or is made a thin film at these portions.

Thereafter, the interlayer insulating film 25 is laminated by CVD on the tensile stress film 24. Consequently, the semiconductor device 1 shown in FIG. 1 is obtained.

The tensile stress film 24 for applying the tensile stress to the channel region 15 in the top layer portion of the semiconductor layer 2 opposing the gate insulating film 18 is formed on the semiconductor layer 2, the gate electrode 11, and the gate electrode 19 after the peripheral edges of the main body 14 of the sidewall 12 have been shaped to protrude laterally beyond the base 13 by the etching of the base 13 of the sidewall 12. The tensile stress film 24 is thus interrupted at the portions opposing the base 13 of the sidewall 12 or is made a thin film at these portions. Thus, an adequate tensile stress in the direction of increasing the ON current of the NMOSFET 30 can be applied to the channel region 15 of the NMOSFET 30 without applying a large tensile stress in the direction of decreasing the ON current of the PMOSFET 31 to the channel region 7 of the PMOSFET 31. Consequently, the tensile stress can be applied to the channel region 15 of the NMOSFET 30 without causing a significant increase in the number of manufacturing steps.

Figure 3:
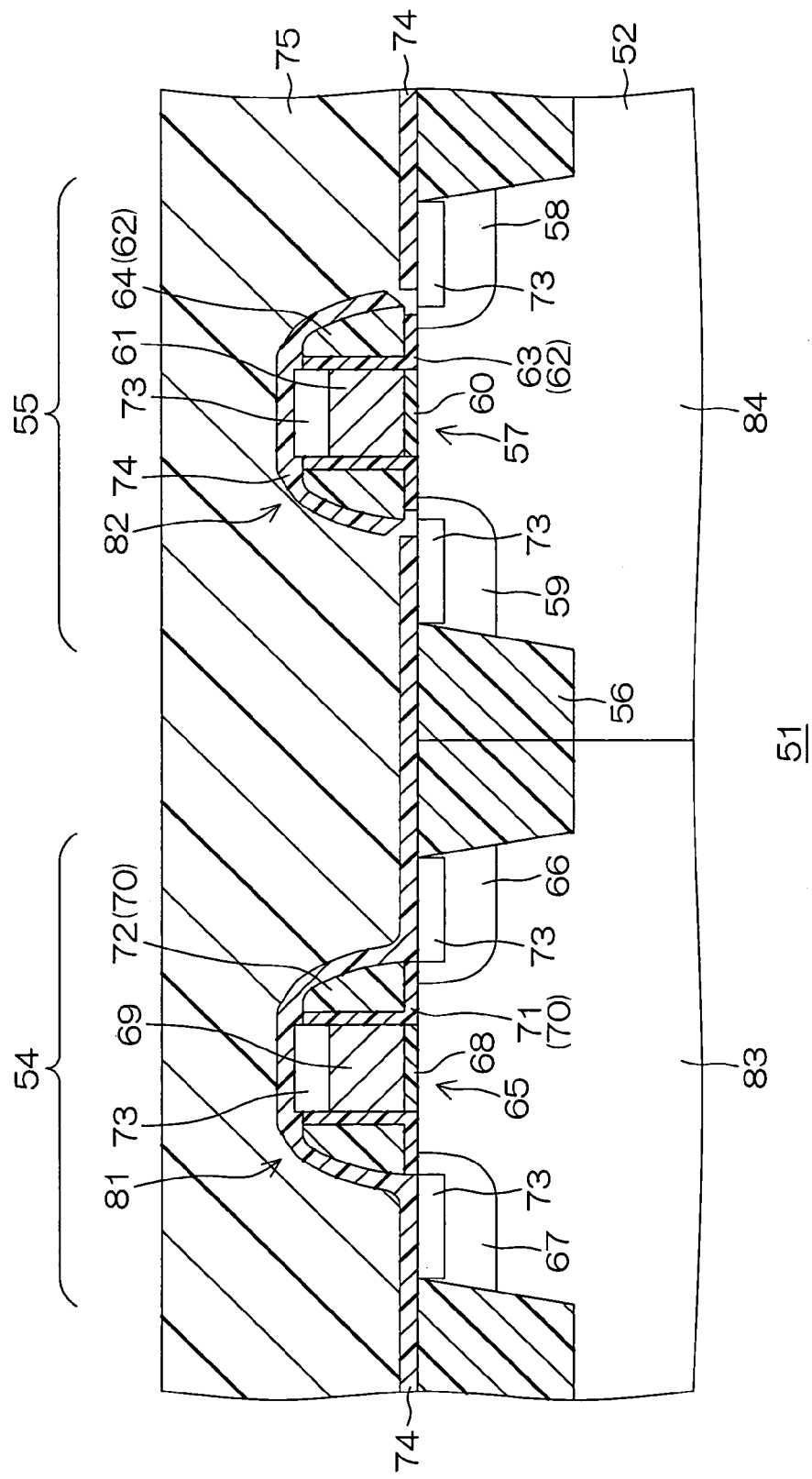
FIG. 3 is a schematic sectional view of a structure of a semiconductor device according to a second embodiment of the present invention.

FIG. 3 is a schematic sectional view of a structure of a semiconductor device according to a second embodiment of the present invention.

The semiconductor device 51 has a CMOS structure including a planar NMOSFET 81 and PMOSFET 82.

In the semiconductor device 51, a P$^-$-type semiconductor layer 52 is laminated on an unillustrated semiconductor substrate.

An element separating portion 56 is formed in a top layer portion of the semiconductor layer 52. The element separating portion 56 rectangularly surrounds an NMOSFET forming region 54 in which the NMOSFET 81 is formed and a PMOSFET forming region 55 in which the PMOSFET 82 is formed. The element separating portion 56 has a structure where SiO$_2$ (silicon oxide) or other insulator is embedded in grooves dug in comparatively shallowly from a top surface of the semiconductor layer 52 (for example, shallow trenches of 0.2 to 0.5 μm depth). The NMOSFET forming region 54 and the PMOSFET forming region 55 are insultingly separated by the element separating portion 56.

An N well 84 is formed in a top layer portion of the semiconductor layer 52 in the PMOSFET forming region 55. In a top layer portion of the N well 84 (the top layer portion of the semiconductor layer 52 in the PMOSFET forming region 55), a P$^+$-type source region 58 and a drain region 59 are formed across a channel region 57.

A gate insulating film 60 is formed as a first gate insulating film made of SiO$_2$ on the channel region 57. A gate electrode 61 is formed as a first gate electrode made of polysilicon on the gate insulating film 60.

A sidewall 62 is formed as a first sidewall at a periphery of the gate electrode 61. Side surfaces of the gate insulating film 60 and the gate electrode 61 are surrounded by the sidewall 62. The sidewall 62 includes a base 63, made of $SiO_2$, and a main body 64, made of SiN.

The base 63 has, for example, a film thickness of 5 to 10 nm and is formed to an L-like cross section in contact with the semiconductor layer 52, the gate insulating film 60, and the gate electrode 61.

The main body 64 is formed on the base 63, has a substantially triangular cross section, and opposes an entirety of the side surfaces of the gate electrode 61. Peripheral edges of the main body 64 protrude laterally beyond peripheral edges of the base 63.

A P well 83 is formed in a top layer portion of the semiconductor layer 52 in the NMOSFET forming region 54. In a top layer portion of the P well 83 (the top layer portion of the semiconductor layer 52 in the NMOSFET forming region 54), an $N^+$-type source region 66 and a drain region 67 are formed across a channel region 65.

A gate insulating film 68 is formed as a second gate insulating film made of $SiO_2$ on the channel region 65. A gate electrode 69 is formed as a second gate electrode made of polysilicon on the gate insulating film 68.

A sidewall 70 is formed as a second sidewall at a periphery of the gate electrode 69. Side surfaces of the gate insulating film 68 and the gate electrode 69 are surrounded by the sidewall 70. The sidewall 70 includes a base 71, made of $SiO_2$, and a main body 72, made of SiN.

The base 71 has, for example, a film thickness of 5 to 10 nm and is formed to an L-like cross section in contact with the semiconductor layer 52, the gate insulating film 68, and the gate electrode 69.

The main body 72 is formed on the base 71, has a substantially triangular cross section, and opposes an entirety of the side surfaces of the gate electrode 69. Peripheral edges of the main body 72 and peripheral edges of the base 71 are overlapped.

A tensile stress in a direction of increasing an ON current of the NMOSFET 81 is memorized in the channel region 65 in the top layer portion of the semiconductor layer 52 opposing the gate insulating film 68.

Co silicide 73 for electrical connection (contact) is formed in respective surface layer portions of the source regions 58 and 66, the drain regions 59 and 67, the gate electrode 61, and the gate electrode 69.

A contact stopper film 74, made of SiN is formed on the semiconductor layer 52, the gate electrode 61, and the gate electrode 69. In the NMOSFET forming region 54, the contact stopper film 74 covers the semiconductor layer 52, the gate electrode 69, and the sidewall 70 continuously. In the PMOSFET forming region 55, the contact stopper film 74 covers the semiconductor layer 52, the gate electrode 61, and the sidewall 62. However, due to the peripheral edges of the main body 64 of the sidewall 62 protruding laterally beyond the base 63, the contact stopper film 74 is interrupted at portions opposing the base 63 of the sidewall 62 or is made a thin film at these portions.

An interlayer insulating film 75 made of $SiO_2$ is formed on the contact stopper film 74.

A tensile stress in a direction of increasing the ON current of the NMOSFET 81 is thus memorized in the channel region 65 of the NMOSFET 81. The ON current of the NMOSFET 81 can thus be increased.

FIGS. 4A to 4L are schematic sectional views illustrating, in order of process, a method for manufacturing the semiconductor device shown in FIG. 3.

First, grooves corresponding to the element separating portion 56 are formed in a top layer portion of the semiconductor layer 52 by reactive ion etching. An $SiO_2$ film is then deposited by LPCVD on the semiconductor layer 52 to a thickness completely filling the respective grooves. Portions of the $SiO_2$ film extending outside the respective grooves are then selectively removed and by the $SiO_2$ film remaining only on the grooves, the element separating portion 56 is formed. Selective removal of the $SiO_2$ film can be achieved by CMP.

Figure 4A:
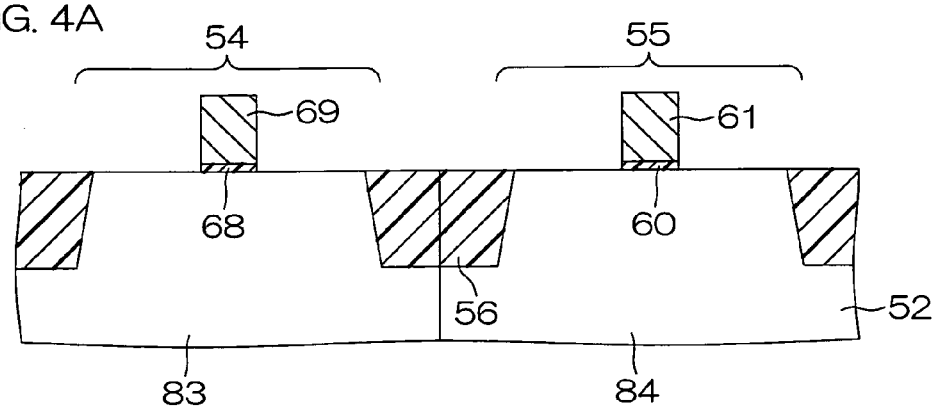
FIG. 4A is a schematic sectional view for describing a method for manufacturing the semiconductor device of FIG. 3.

Thereafter, an $SiO_2$ film is formed on the semiconductor layer 52 by a thermal oxidation method. A polysilicon layer is then formed by CVD on the $SiO_2$ film. By the $SiO_2$ film and the polysilicon film then being selectively removed by photolithography and etching, the gate insulating film 60 and the gate electrode 61 are formed in the PMOSFET forming region 55 and the gate insulating film 68 and the gate electrode 69 are formed in the NMOSFET forming region 54 as shown in FIG. 4A.

Figure 4B:
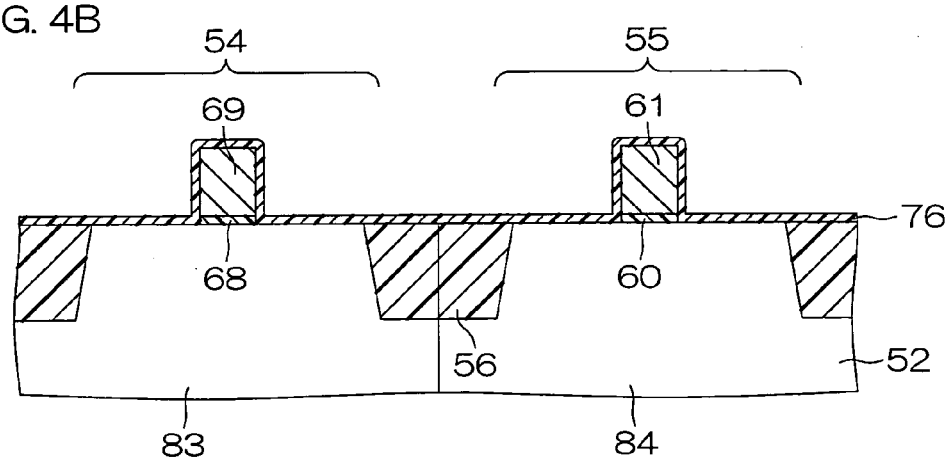
FIG. 4B is a schematic sectional view of a step subsequent to that of FIG. 4A.

Then, as shown in FIG. 4B, an oxide film 76 made of $SiO_2$ is formed by LPCVD on the semiconductor layer 52, the gate electrode 61, and the gate electrode 69.

Figure 4C:
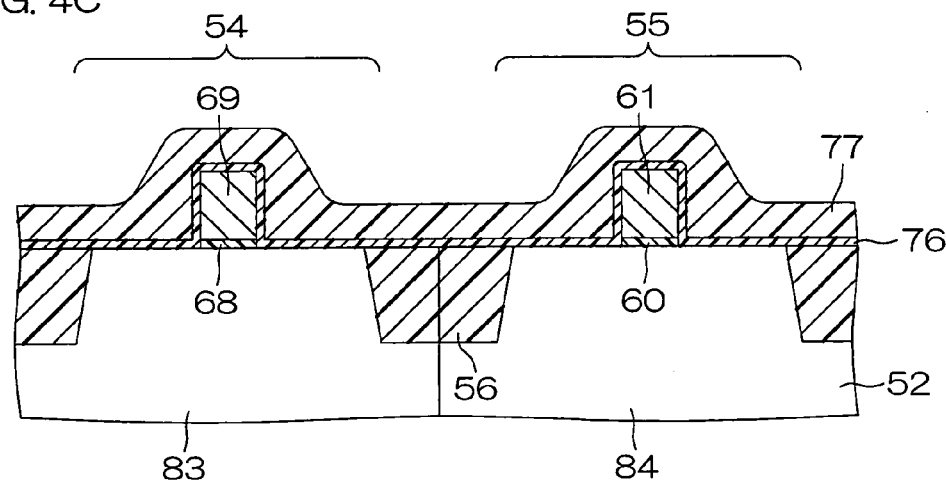
FIG. 4C is a schematic sectional view of a step subsequent to that of FIG. 4B.

Thereafter, a nitride film 77 made of SiN is formed by LPCVD on the oxide film 76 as shown in FIG. 4C.

Figure 4D:
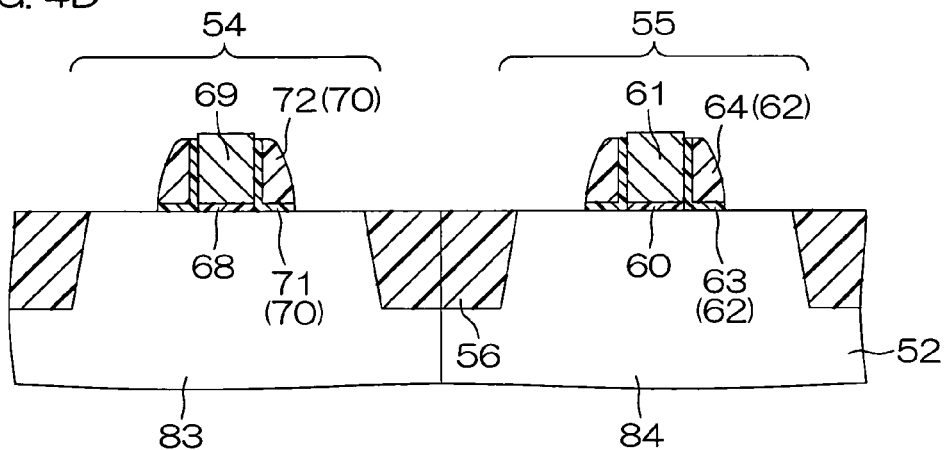
FIG. 4D is a schematic sectional view of a step subsequent to that of FIG. 4C.

Then, as shown in FIG. 4D, by the oxide film 76 and the nitride film 77 being etched back until upper surfaces of the gate electrode 61 and the gate electrode 69 are exposed, the sidewall 62 is formed at the periphery of the gate insulating film 60 and the gate electrode 61 and the sidewall 70 is formed at the periphery of the gate insulating film 68 and the gate electrode 69. At this point, the peripheral edges of the main body 64 of the sidewall 62 are overlapped with the peripheral edges of the base 63. The peripheral edges of the main body 72 of the sidewall 70 are overlapped with the peripheral edges of the base 71.

Figure 4E:
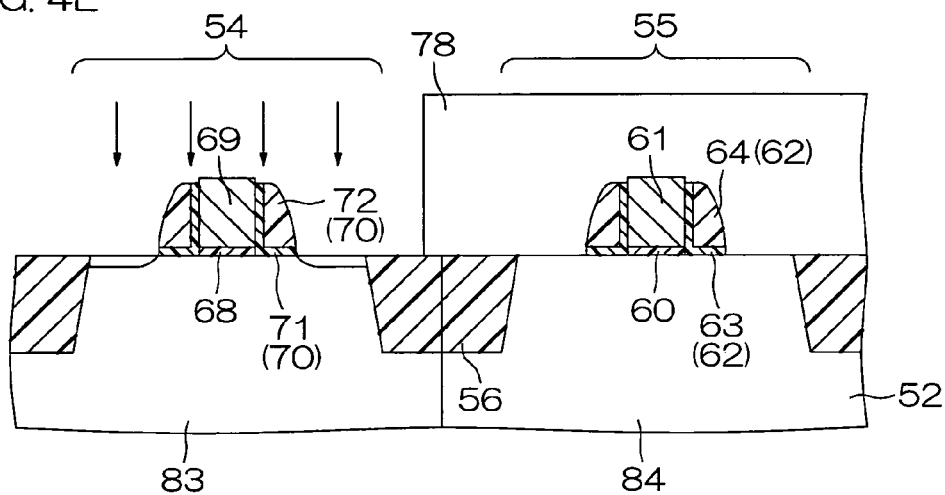
FIG. 4E is a schematic sectional view of a step subsequent to that of FIG. 4D.

Thereafter, as shown in FIG. 4E, a resist pattern 78 having an opening opposing the NMOSFET forming region 54 is formed on the semiconductor layer 52. An N-type impurity is implanted into a top layer portion of the semiconductor layer 52 via the opening of the resist pattern 78. After implantation of the N-type impurity, the resist pattern 78 is removed.

Figure 4F:
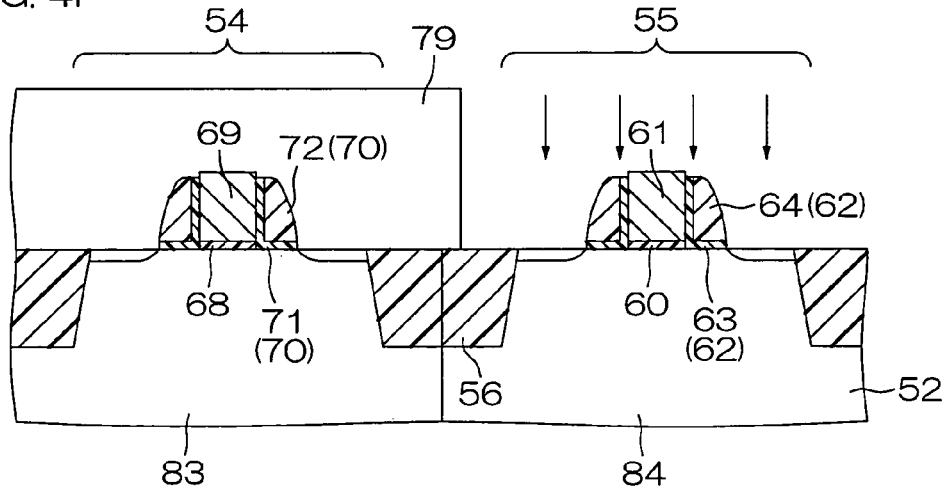
FIG. 4F is a schematic sectional view of a step subsequent to that of FIG. 4E.

Then, as shown in FIG. 4F, a resist pattern 79 having an opening opposing the PMOSFET forming region 55 is formed on the semiconductor layer 52. A P-type impurity is implanted into a top layer portion of the semiconductor layer 52 via the opening of the resist pattern 79.

Figure 4G:
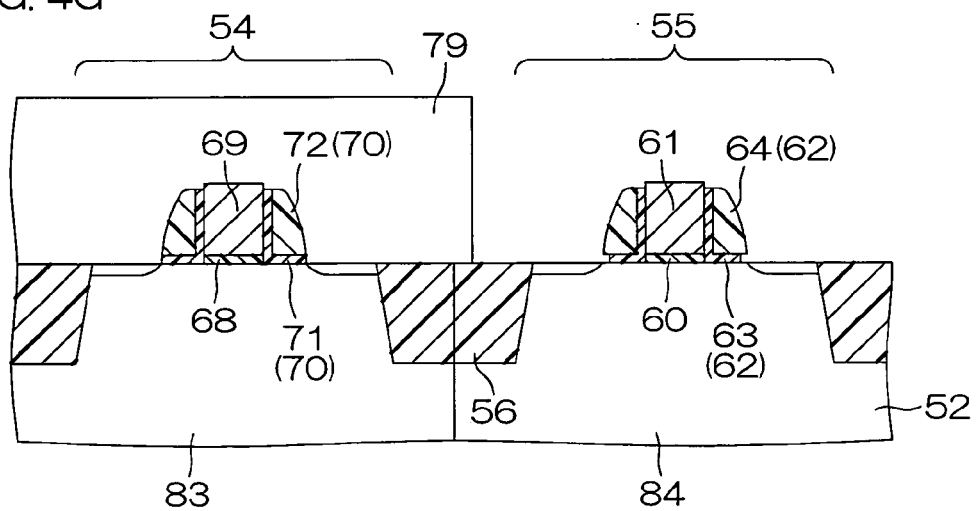
FIG. 4G is a schematic sectional view of a step subsequent to that of FIG. 4F.

Thereafter, as shown in FIG. 4G, peripheral edge portions of the base 63 of the sidewall 62 are removed by wet etching. That is, a solution capable of etching the base 63 is supplied to the base 63 via the opening of the resist pattern 79 and portions of the base 63 sandwiched by peripheral edge portions of the main body 64 and the semiconductor layer 52 are removed. Consequently, the peripheral edges of the main body 64 are shaped to protrude laterally with respect to the peripheral edges of the base 63. After the wet etching of the base 63, the resist pattern 79 is removed.

Figure 4H:
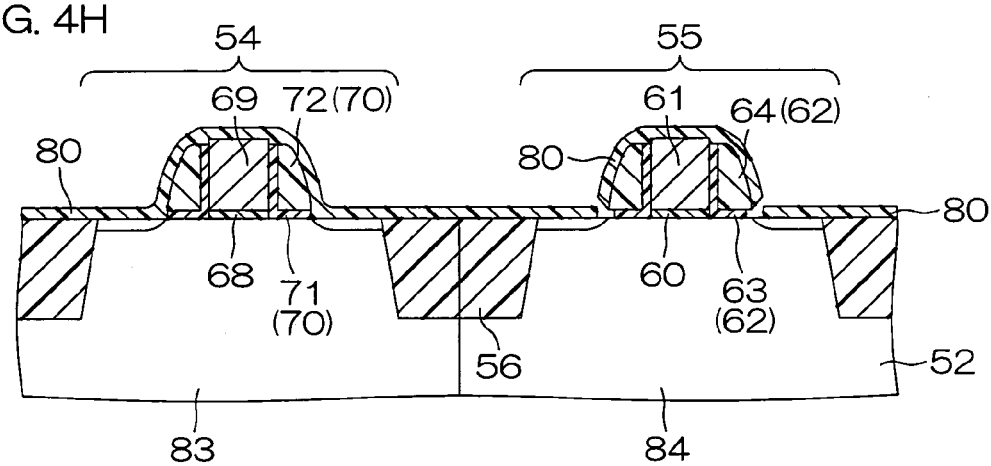
FIG. 4H is a schematic sectional view of a step subsequent to that of FIG. 4G.

Then, as shown in FIG. 4H, a tensile stress film 80, in which is accumulated a tensile stress in a direction from an outer side to an inner side thereof, is formed by CVD on the semiconductor layer 52, the gate electrode 61, and the gate electrode 69. In the NMOSFET forming region 54, the tensile stress film 80 covers an entirety of the surfaces of the semiconductor layer 52, the gate electrode 69, and the sidewall 70 continuously. In the PMOSFET forming region 55, the tensile stress film 80 covers the surface of the semiconductor layer 52, the gate electrode 61, and the sidewall 62. However, due to the peripheral edges of the main body 64 of the sidewall 62 protruding laterally beyond the base 63, the tensile stress film 80 is interrupted at portions opposing the base 63 of the sidewall 62 or is made a thin film at these portions.

Figure 4I:
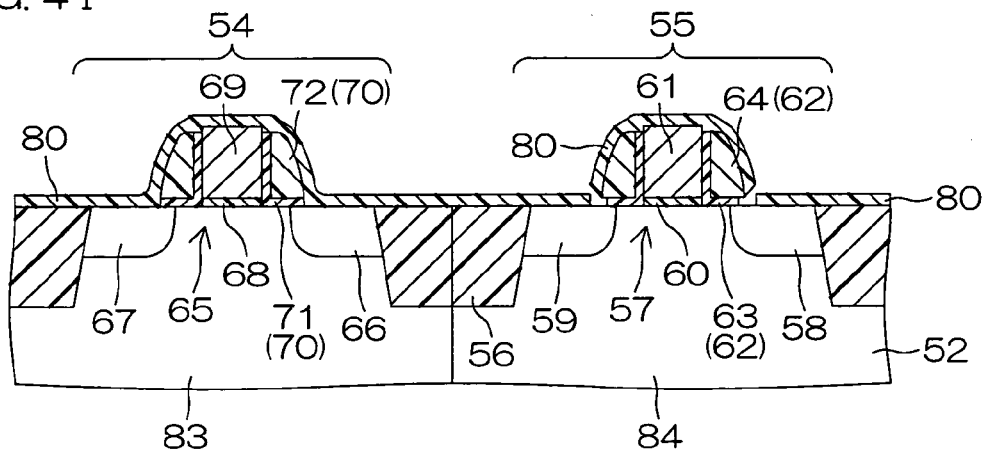
FIG. 4I is a schematic sectional view of a step subsequent to that of FIG. 4H.

Thereafter, an annealing treatment is performed. The source region 58 and the drain region 59 are thereby formed in the top layer portion of the semiconductor layer 52 in the PMOSFET forming region 55 as shown in FIG. 4I. Further, the source region 66 and the drain region 67 are formed in the top layer portion of the semiconductor layer 52 in the NMOSFET forming region 54. Further, by this annealing treatment, the tensile stress possessed by the tensile stress film 80 is memorized in the channel region 65 of the NMOSFET 81. The channel region 65 is thereby enabled to maintain the state in which the tensile stress is applied even after removal of the tensile stress film 80.

Figure 4J:
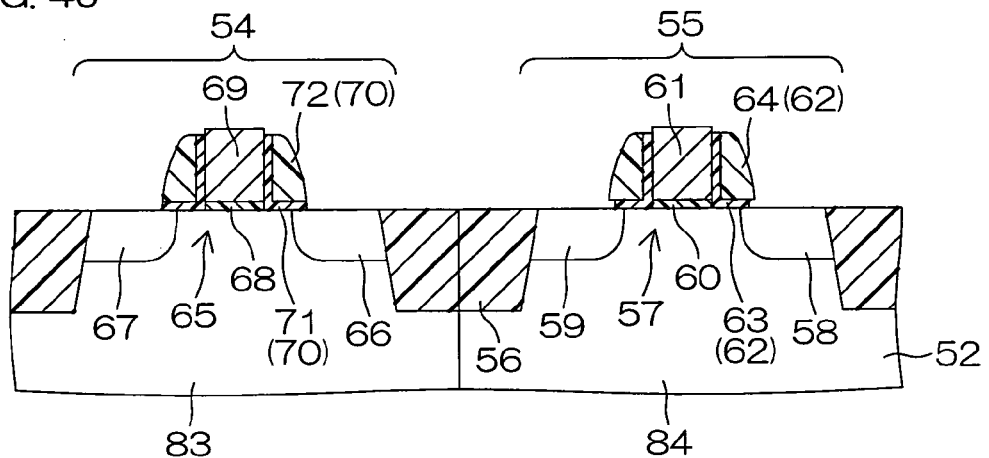
FIG. 4J is a schematic sectional view of a step subsequent to that of FIG. 4I.

After the annealing treatment, the tensile stress film 80 is removed as shown in FIG. 4J.

Figure 4K:
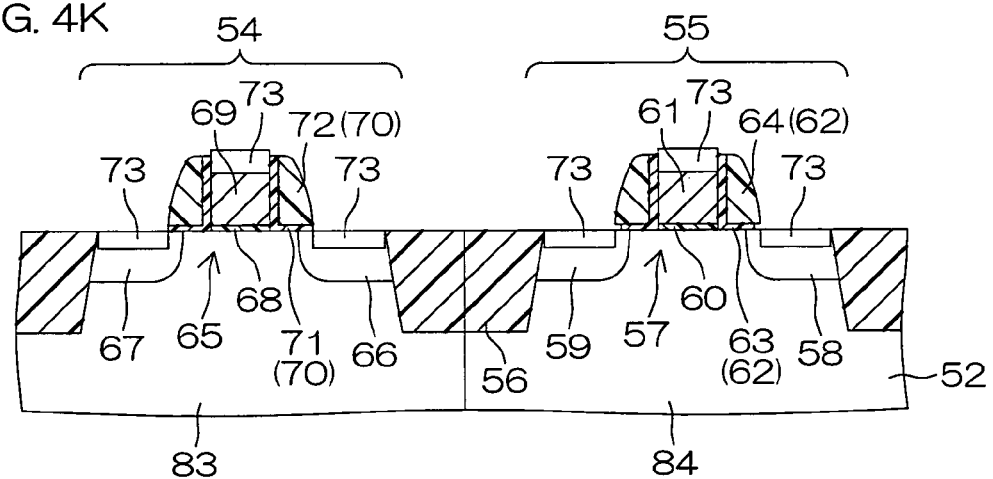
FIG. 4K is a schematic sectional view of a step subsequent to that of FIG. 4J.

Thereafter, as shown in FIG. 4K, a Co film (not shown) is formed by PVD on the source regions 58 and 66, the drain regions 59 and 67, the gate electrode 61, and the gate electrode 69. By an annealing treatment being performed thereafter, the Co silicide 73 for electrical connection (contact) is formed in the respective surface layer portions of the source regions 58 and 66, the drain regions 59 and 67, the gate electrode 61, and the gate electrode 69.

Figure 4L:
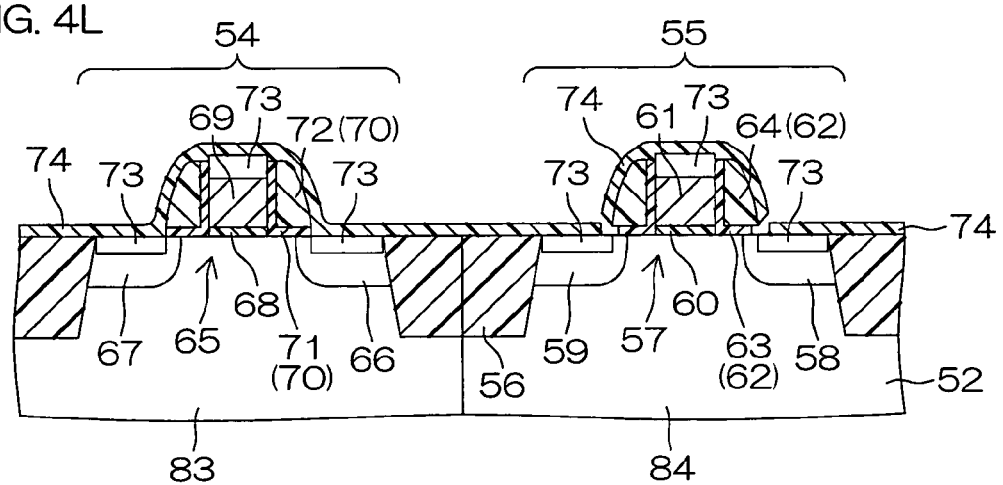
FIG. 4L is a schematic sectional view of a step subsequent to that of FIG. 4K.

Then, as shown in FIG. 4L, the contact stopper film 74 is formed by CVD on the semiconductor layer 52, the gate electrode 61, and the gate electrode 69. In the NMOSFET forming region 54, the contact stopper film 74 covers the semiconductor layer 52, the gate electrode 69, and the sidewall 70 continuously. In the PMOSFET forming region 55, the contact stopper film 74 covers the semiconductor layer 52, the gate electrode 61, and the sidewall 62. However, due to the peripheral edges of the main body 64 of the sidewall 62 protruding laterally beyond the base 63, the contact stopper film 74 is interrupted at the portions opposing the base 63 of the sidewall 62 or is made a thin film at these portions.

Thereafter, the interlayer insulating film 75 is laminated by CVD on the contact stopper film 74. Consequently, the semiconductor device 51 shown in FIG. 3 is obtained.

The tensile stress film 80 for applying the tensile stress to the channel region 65 in the top layer portion of the semiconductor layer 52 opposing the gate insulating film 68 is formed on the semiconductor layer 52, the gate electrode 61, and the gate electrode 69 after the peripheral edges of the main body 64 of the sidewall 62 have been shaped to protrude laterally beyond the base 63 by the etching of the base 63 of the sidewall 62. The tensile stress film 80 is thus interrupted at the portions opposing the base 63 of the sidewall 62 or is made a thin film at these portions. Thus, when the annealing treatment is performed, an adequate tensile stress in the direction of increasing the ON current of the NMOSFET 81 can be memorized in the channel region 65 of the NMOSFET 81 without applying a large tensile stress in the direction of decreasing the ON current of the PMOSFET 82 to the channel region 60 of the PMOSFET 82.

Figure 5:
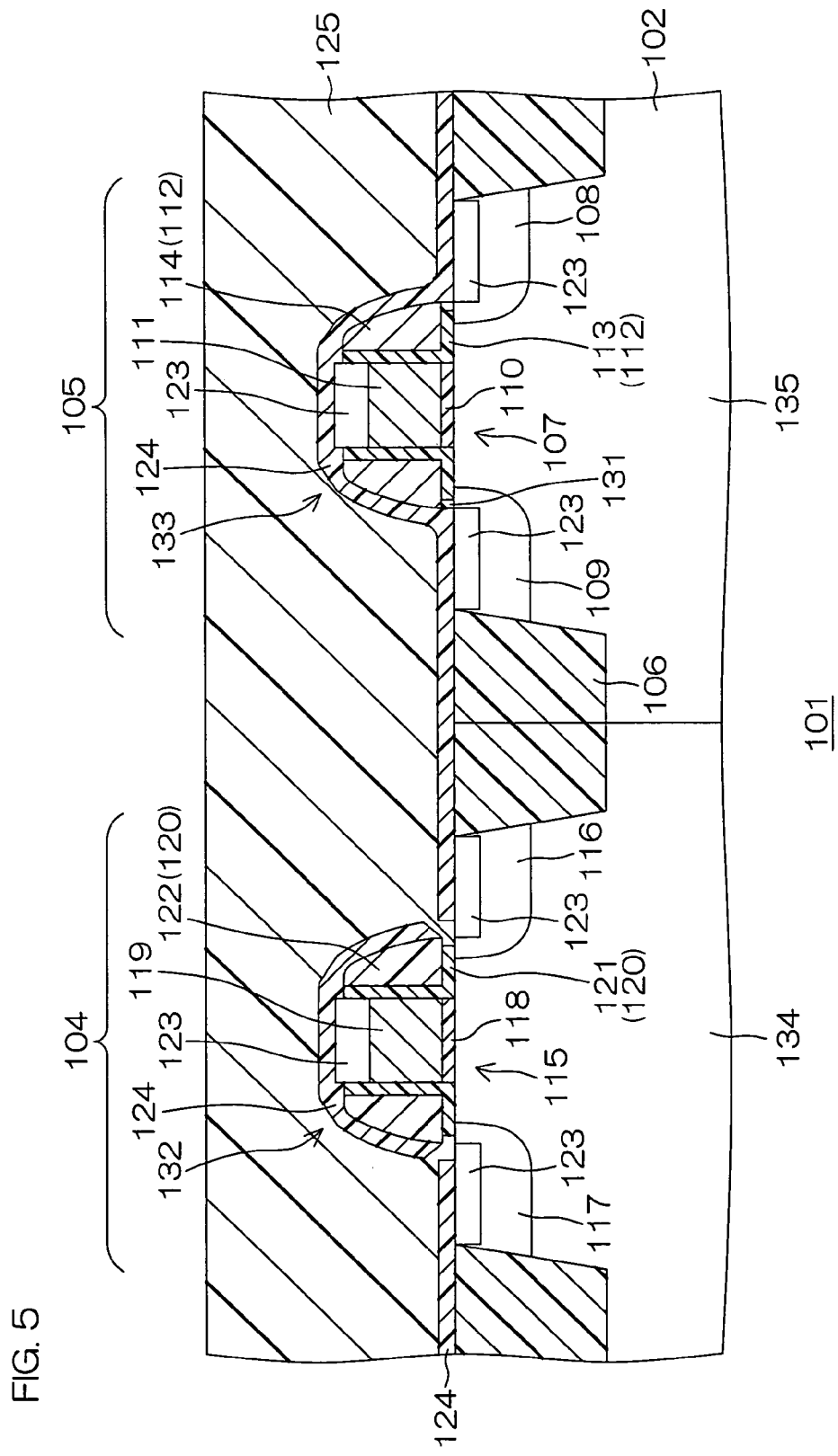
FIG. 5 is a schematic sectional view of a structure of a semiconductor device according to a third embodiment of the present invention.

FIG. 5 is a schematic sectional view of a structure of a semiconductor device according to a third embodiment of the present invention.

The semiconductor device 101 has a CMOS structure including a planar NMOSFET 132 and PMOSFET 133.

In the semiconductor device 101, a P⁻-type semiconductor layer 102 is laminated on an unillustrated semiconductor substrate.

An element separating portion 106 is formed in a top layer portion of the semiconductor layer 102. The element separating portion 106 rectangularly surrounds an NMOSFET forming region 104 in which the NMOSFET 132 is formed and a PMOSFET forming region 105 in which the PMOSFET 133 is formed. The element separating portion 106 has a structure where $SiO_2$ or other insulator is embedded in grooves dug in comparatively shallowly from a top surface of the semiconductor layer 102 (for example, shallow trenches of 0.2 to 0.5 μm depth). The NMOSFET forming region 104 and the PMOSFET forming region 105 are insultingly separated by the element separating portion 106.

An N well 135 is formed in a top layer portion of the semiconductor layer 102 in the PMOSFET forming region 105. In a top layer portion of the N well 135 (the top layer portion of the semiconductor layer 102 in the PMOSFET forming region 105), a P⁺-type source region 108 and a drain region 109 are formed across a channel region 107.

A gate insulating film 110 is formed as a first gate insulating film made of $SiO_2$ on the channel region 107. A gate electrode 111 is formed as a first gate electrode made of polysilicon on the gate insulating film 110.

A sidewall 112 is formed as a first sidewall at a periphery of the gate electrode 111. Side surfaces of the gate insulating film 110 and the gate electrode 111 are surrounded by the sidewall 112. The sidewall 112 includes a base 113, made of $SiO_2$, and a main body 114, made of SiN.

The base 113 has, for example, a film thickness of 5 to 10 nm and is formed to an L-like cross section in contact with the semiconductor layer 102, the gate insulating film 110, and the gate electrode 111.

The main body 114 is formed on the base 113, has a substantially triangular cross section, and opposes an entirety of the side surfaces of the gate electrode 111. Peripheral edges of the main body 114 protrude laterally beyond peripheral edges of the base 113. Further, an oxide film 131 made of $SiO_2$ is interposed between the peripheral edges of the main body 114 and the semiconductor layer 102. Side surfaces of the oxide film 131 are substantially flush with the side surfaces of the main body 114.

A P well 134 is formed in a top layer portion of the semiconductor layer 102 in the NMOSFET forming region 104. In a top layer portion of the P well 134 (the top layer portion of the semiconductor layer 102 in the NMOSFET forming region 104), an N⁺-type source region 116 and a drain region 117 are formed across a channel region 115.

A gate insulating film 118 is formed as a second gate insulating film made of $SiO_2$ on the channel region 115. A gate electrode 119 is formed as a second gate electrode made of polysilicon on the gate insulating film 118.

A sidewall 120 is formed as a second sidewall at a periphery of the gate electrode 119. Side surfaces of the gate insulating film 118 and the gate electrode 119 are surrounded by the sidewall 120. The sidewall 120 includes a base 121, made of $SiO_2$, and a main body 122, made of SiN.

The base 121 has, for example, a film thickness of 5 to 10 nm and is formed to an L-like cross section in contact with the semiconductor layer 102, the gate insulating film 118, and the gate electrode 119.

The main body 122 is formed on the base 121, has a substantially triangular cross section, and opposes an entirety of the side surfaces of the gate electrode 119. Peripheral edges of the main body 122 protrude laterally with respect to peripheral edges of the base 121.

A tensile stress in a direction of increasing an ON current of the NMOSFET 132 is memorized in the channel region 115 of the NMOSFET 132.

Co silicide 123 for electrical connection is formed in respective surface layer portions of the source regions 108 and 116, the drain regions 109 and 117, the gate electrode 111, and the gate electrode 119.

A compressive stress film 124, made of SiN and in which is accumulated a compressive stress in a direction from an inner side to an outer side thereof, is formed on the semiconductor layer 102, the gate electrode 111, and the gate electrode 119. In the PMOSFET forming region 105, the compressive stress film 124 covers the semiconductor layer 102, the gate electrode 111, and the sidewall 112 continuously. In the NMOSFET forming region 104, the compressive stress film 124 covers the semiconductor layer 102, the gate electrode 119, and the sidewall 120. However, due to the peripheral edges of the main body 122 of the sidewall 120 protruding laterally beyond the base 121, the compressive stress film 124 is interrupted at portions opposing the base 121 of the sidewall 120 or is made a thin film at these portions.

An interlayer insulating film 125 made of $SiO_2$ is formed on the compressive stress film 124.

The tensile stress in a direction of increasing the ON current of the NMOSFET 132 is thus memorized in the channel region 115 of the NMOSFET 132. Further, the main body 122 of the sidewall 120 of the NMOSFET 132 protrude laterally beyond the base 121. The base 121 of the sidewall 120 is thus not covered by the compressive stress film 124 or even if covered, is not covered adequately. An adequate compressive stress in a direction of increasing an ON current of the PMOSFET 133 can thus be applied by the compressive stress film 124 to the channel region 107 of the PMOSFET 133 without applying a large compressive stress in a direction of decreasing an ON current of the NMOSFET 132 to the channel region 115 of the NMOSFET 132. Consequently, the stresses respectively suited to the channel regions 107 and 115 of the NMOSFET 132 and PMOSFET 133 can be applied without causing a significant increase in the number of manufacturing steps.

Figure 6A:
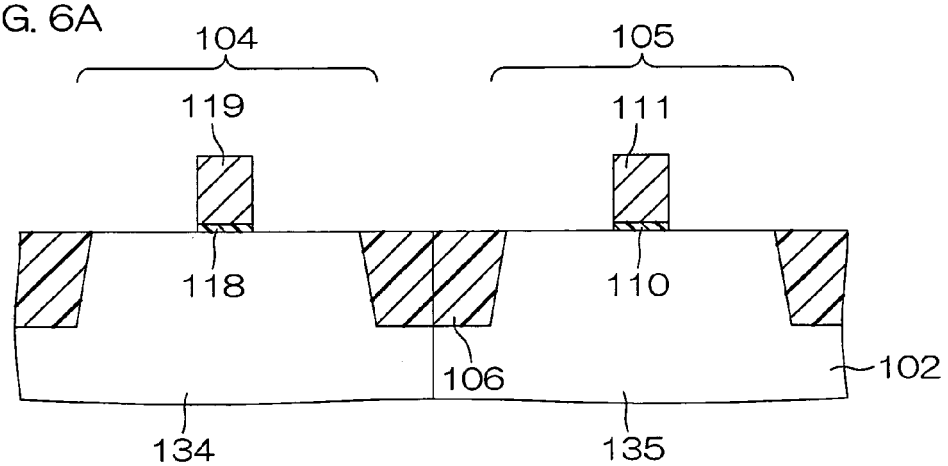
FIG. 6A is a schematic sectional view for describing a method for manufacturing the semiconductor device of FIG. 5.
Figure 6B:
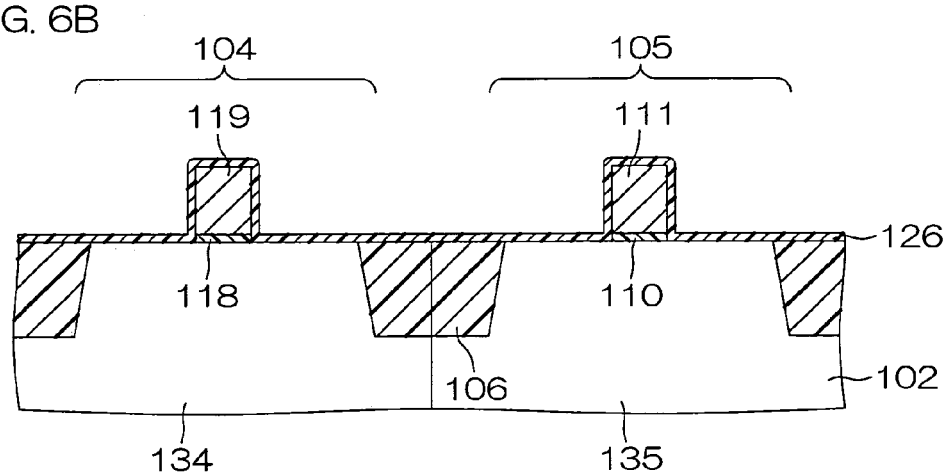
FIG. 6B is a schematic sectional view of a step subsequent to that of FIG. 6A.
Figure 6C:
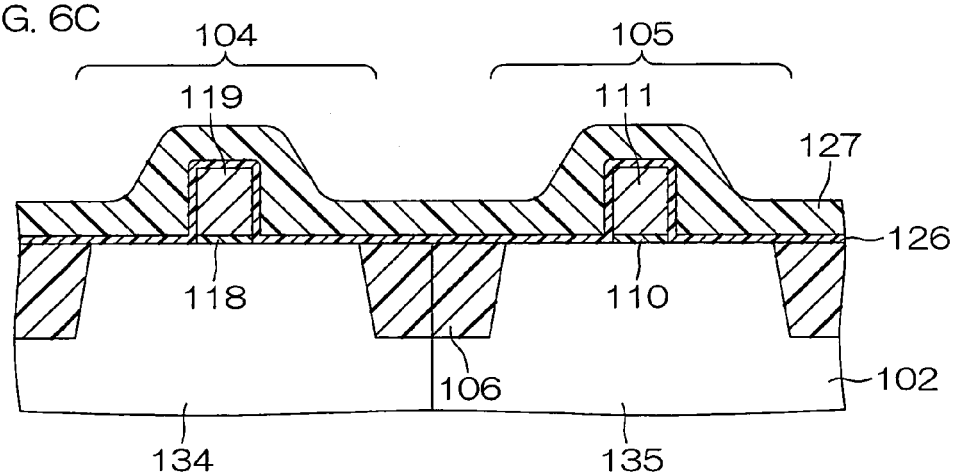
FIG. 6C is a schematic sectional view of a step subsequent to that of FIG. 6B.
Figure 6D:
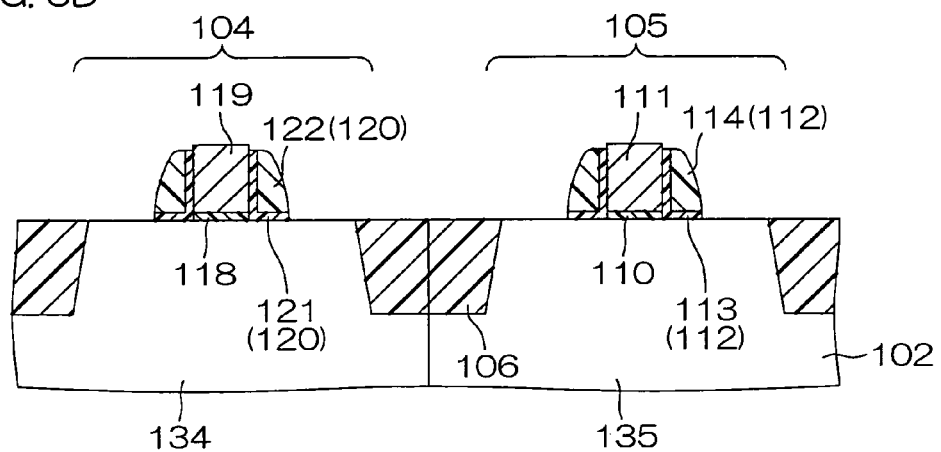
FIG. 6D is a schematic sectional view of a step subsequent to that of FIG. 6C.
Figure 6E:
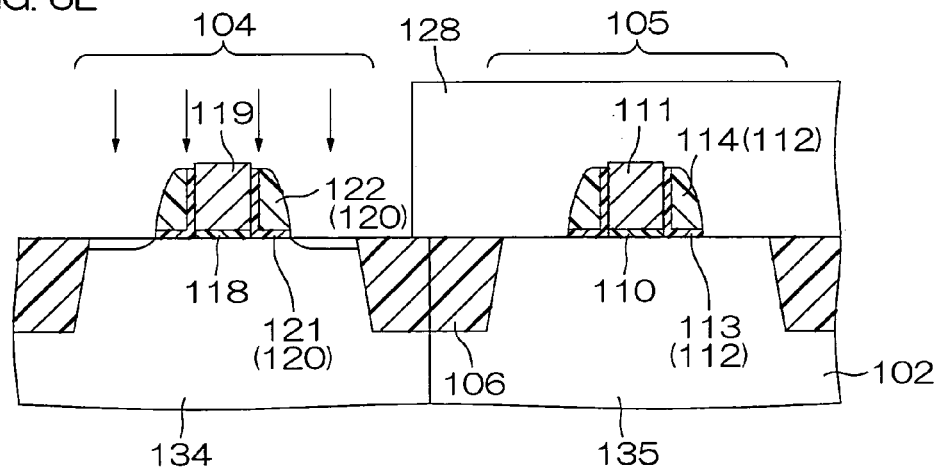
FIG. 6E is a schematic sectional view of a step subsequent to that of FIG. 6D.
Figure 6F:
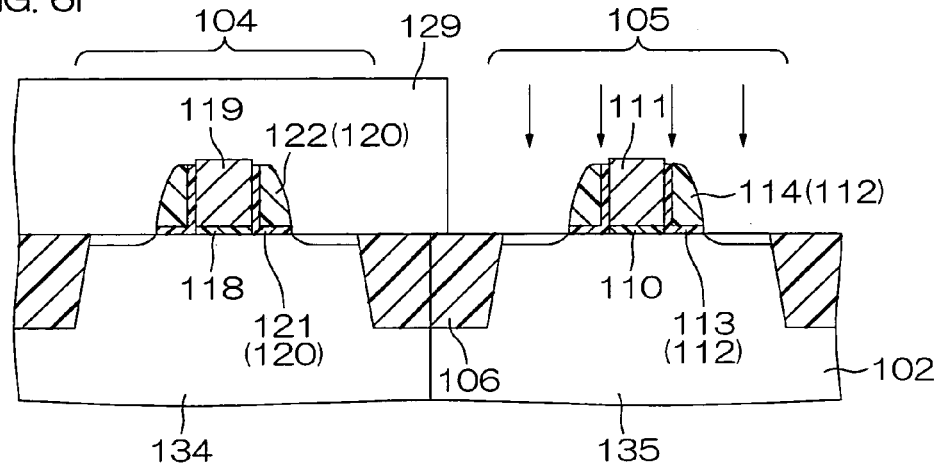
FIG. 6F is a schematic sectional view of a step subsequent to that of FIG. 6E.
Figure 6G:
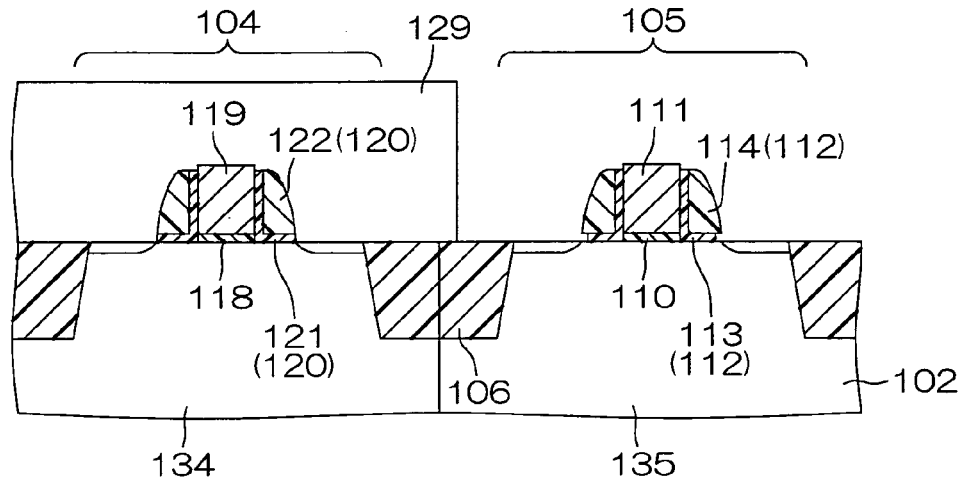
FIG. 6G is a schematic sectional view of a step subsequent to that of FIG. 6F.
Figure 6H:
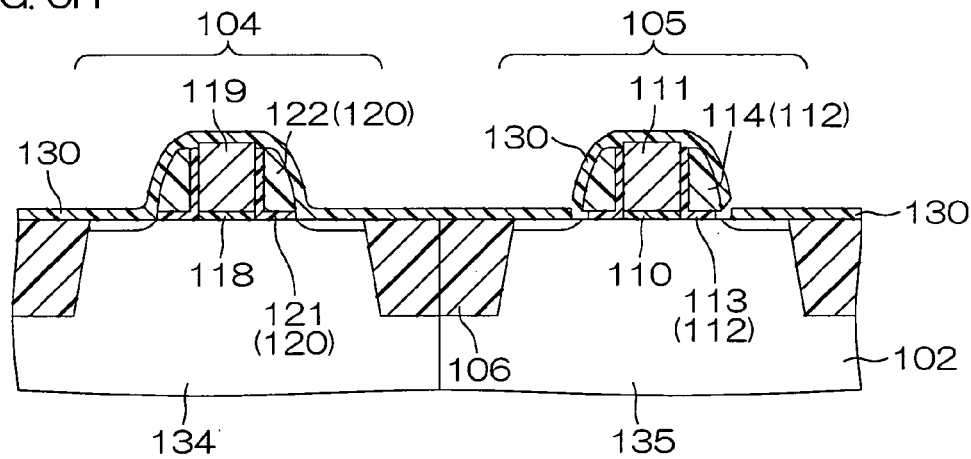
FIG. 6H is a schematic sectional view of a step subsequent to that of FIG. 6G.
Figure 6I:
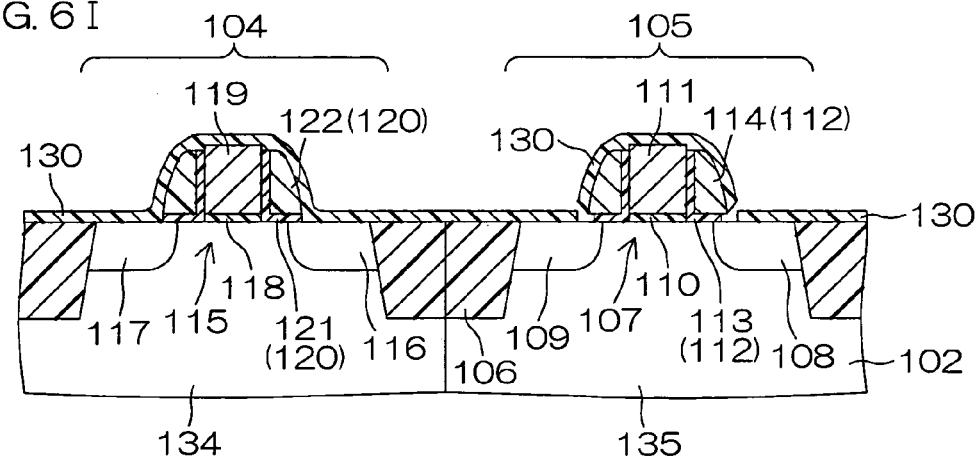
FIG. 6I is a schematic sectional view of a step subsequent to that of FIG. 6H.
Figure 6J:
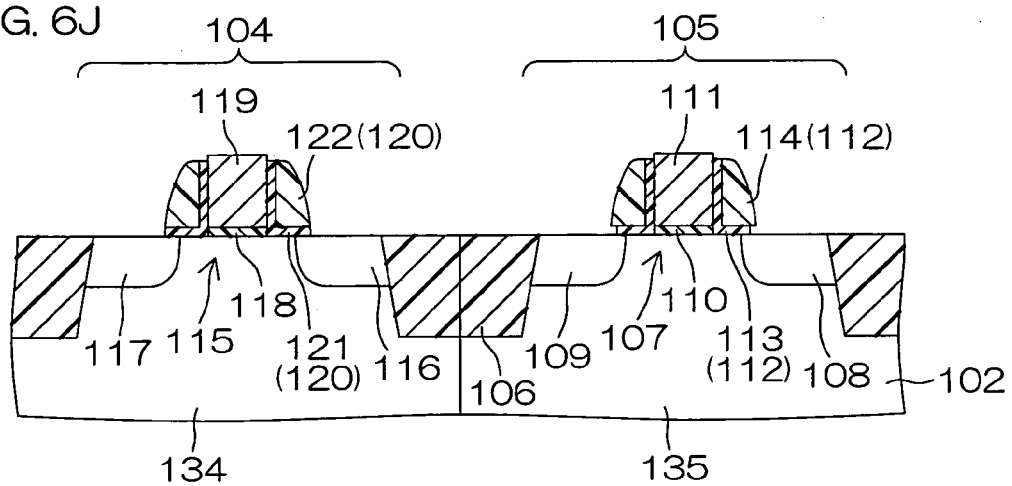
FIG. 6J is a schematic sectional view of a step subsequent to that of FIG. 6I.
Figure 6K:
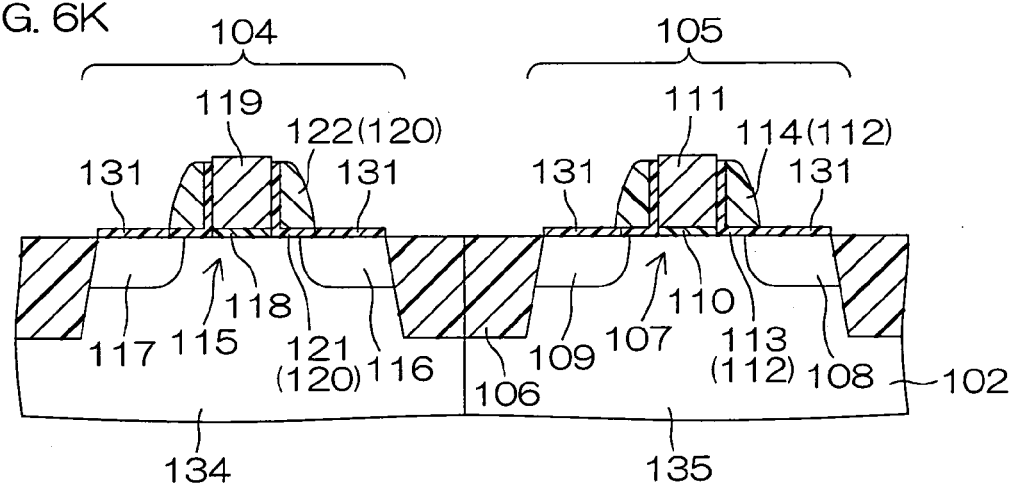
FIG. 6K is a schematic sectional view of a step subsequent to that of FIG. 6J.
Figure 6L:
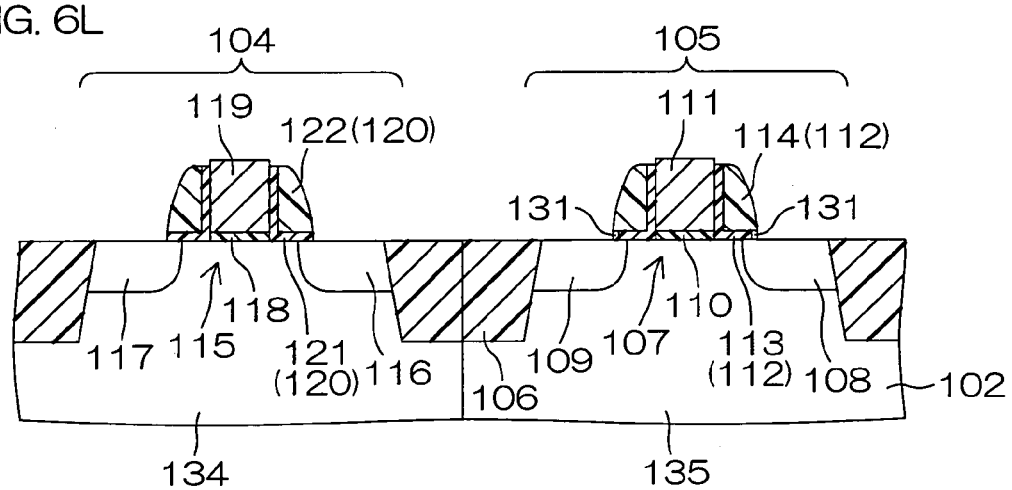
FIG. 6L is a schematic sectional view of a step subsequent to that of FIG. 6K.
Figure 6M:
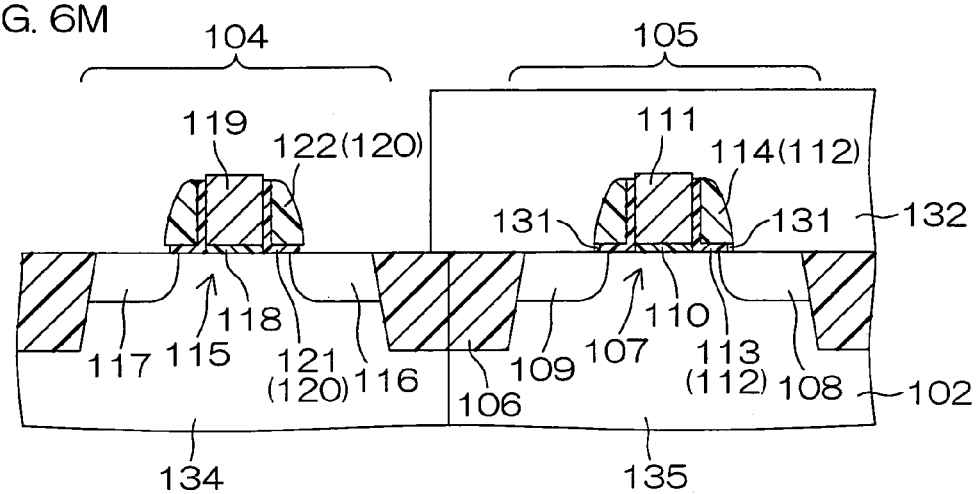
FIG. 6M is a schematic sectional view of a step subsequent to that of FIG. 6L.
Figure 6N:
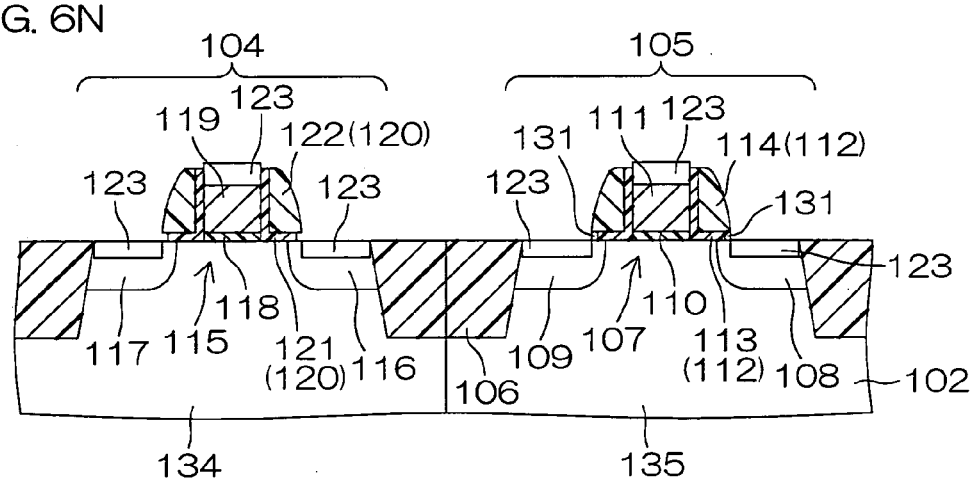
FIG. 6N is a schematic sectional view of a step subsequent to that of FIG. 6M.
Figure 6O:
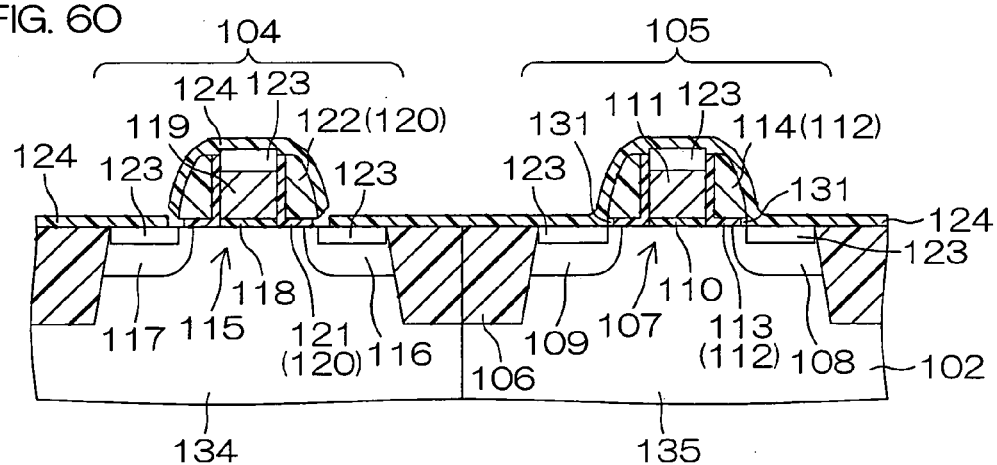
FIG. 6O is a schematic sectional view of a step subsequent to that of FIG. 6N.

FIGS. 6A to 6O are schematic sectional views illustrating, in order of process, a method for manufacturing the semiconductor device shown in FIG. 5.

First, grooves corresponding to the element separating portion 106 are formed in a top layer portion of the semiconductor layer 102 by reactive ion etching. An $SiO_2$ film is then deposited by LPCVD on the semiconductor layer 102 to a thickness completely filling the respective grooves. Portions of the $SiO_2$ film extending outside the respective grooves are then selectively removed and by the $SiO_2$ film remaining only on the grooves, the element separating portion 106 is formed. Selective removal of the $SiO_2$ film can be achieved by CMP.

Thereafter, an $SiO_2$ film is formed on the semiconductor layer 102 by a thermal oxidation method. A polysilicon layer is then formed by CVD on the $SiO_2$ film. By the $SiO_2$ film and the polysilicon film then being selectively removed by photolithography and etching, the gate insulating film 110 and the gate electrode 111 are formed in the PMOSFET forming region 105 and the gate insulating film 118 and the gate electrode 119 are formed in the NMOSFET forming region 104 as shown in FIG. 6A.

Then, as shown in FIG. 6B, an oxide film 126 made of $SiO_2$ is formed by LPCVD on the semiconductor layer 102, the gate electrode 111, and the gate electrode 119.

Thereafter, a nitride film 127 made of SiN is formed by LPCVD on the oxide film 126 as shown in FIG. 6C.

Then, as shown in FIG. 6D, by the oxide film 126 and the nitride film 127 being etched back until upper surfaces of the gate electrode 111 and the gate electrode 119 are exposed, the sidewall 112 is formed at the periphery of the gate insulating film 110 and the gate electrode 111 and the sidewall 120 is formed at the periphery of the gate insulating film 118 and the gate electrode 119. At this point, the peripheral edges of the main body 114 of the sidewall 112 are overlapped with the peripheral edges of the base 113. The peripheral edges of the main body 122 of the sidewall 120 are overlapped with the peripheral edges of the base 121.

Thereafter, as shown in FIG. 6E, a resist pattern 128 having an opening opposing the NMOSFET forming region 104 is formed on the semiconductor layer 102. An N-type impurity is implanted into a top layer portion of the semiconductor layer 102 via the opening of the resist pattern 128. After implantation of the N-type impurity, the resist pattern 128 is removed.

Then, as shown in FIG. 6F, a resist pattern 129 having an opening opposing the PMOSFET forming region 105 is formed on the semiconductor layer 102. A P-type impurity is implanted into a top layer portion of the semiconductor layer 102 via the opening of the resist pattern 129.

Thereafter, as shown in FIG. 6G, peripheral edge portions of the base 113 of the sidewall 112 are removed by wet etching. That is, a solution capable of etching the base 113 is supplied to the base 113 via the opening of the resist pattern 129 and portions of the base 113 sandwiched by peripheral edge portions of the main body 114 and the semiconductor layer 102 are removed. Consequently, the peripheral edges of the main body 114 are shaped to protrude laterally with respect to the peripheral edges of the base 113. After the wet etching of the base 113, the resist pattern 129 is removed.

Then, as shown in FIG. 6H, a tensile stress film 130, in which is accumulated a tensile stress in a direction from an outer side to an inner side thereof, is formed by CVD on the semiconductor layer 102, the gate electrode 111, and the gate electrode 119. In the NMOSFET forming region 104, the tensile stress film 130 covers the semiconductor layer 102, the gate electrode 119, and the sidewall 120 continuously. In the PMOSFET forming region 105, the tensile stress film 130 covers the semiconductor layer 102, the gate electrode 111, and the sidewall 112. However, due to the peripheral edges of the main body 114 of the sidewall 112 protruding laterally beyond the base 113, the tensile stress film 130 is interrupted at portions opposing the base 113 of the sidewall 112 or is made a thin film at these portions.

An annealing treatment is then performed. The source region 108 and the drain region 109 are thereby formed in the top layer portion of the semiconductor layer 102 in the PMOSFET forming region 105 as shown in FIG. 6I. Further, the source region 116 and the drain region 117 are formed in the top layer portion of the semiconductor layer 102 in the NMOSFET forming region 104. Further, by this annealing treatment, the tensile stress possessed by the tensile stress film 130 is memorized in the channel region 115 of the NMOSFET 132. The channel region 115 is thereby enabled to maintain the state in which the tensile stress is applied even after removal of the tensile stress film 130.

After the annealing treatment, the tensile stress film 130 is removed as shown in FIG. 6J.

Then, as shown in FIG. 6K, an oxide film 131 is formed by the thermal oxidation method on portions of the semiconductor layer 102 besides portions above the element separating portion 106. The oxide film 131 is formed to a thickness at least no less than a thickness of the base 113.

Thereafter, portions of the oxide film 131 extending outside the main bodies 114 and 122 are removed by etching. Consequently, the oxide film 131, having side surfaces substantially flush to the side surfaces of the main body 114 of the sidewall 112 remains between the peripheral edges of the main body 114 and the semiconductor layer 102.

Then, as shown in FIG. 6M, a resist pattern 132 having an opening opposing the NMOSFET forming region 104 is formed on the semiconductor layer 102. Thereafter, peripheral edge portions of the base 121 of the sidewall 120 are removed by wet etching. That is, a solution capable of etching the base 121 is supplied to the base 121 via the opening of the resist pattern 132 and portions of the base 121 sandwiched by peripheral edge portions of the main body 122 and the semiconductor layer 102 are removed. Consequently, the peripheral edges of the main body 122 are shaped to protrude laterally with respect to the peripheral edges of the base 121. After the wet etching of the base 121, the resist pattern 132 is removed.

Thereafter, as shown in FIG. 6N, a Co film (not shown) is formed by PVD on the source regions 108 and 116, the drain regions 109 and 117, the gate electrode 111, and the gate electrode 119. By an annealing treatment being performed thereafter, the Co silicide 123 for electrical connection (contact) is formed in the respective surface layer portions of the source regions 108 and 116, the drain regions 109 and 117, the gate electrode 111, and the gate electrode 119.

Then, as shown in FIG. 6O, the compressive stress film 124, in which is accumulated the compressive stress in the direction from the inner side to the outer side thereof, is formed by CVD on the semiconductor layer 102, the gate electrode 111, and the gate electrode 119. In the PMOSFET forming region 105, the compressive stress film 124 covers the semiconductor layer 102, the gate electrode 111, and the sidewall 112 continuously. In the NMOSFET forming region 104, the compressive stress film 124 covers the semiconductor layer 102, the gate electrode 119, and the sidewall 120. However, due to the peripheral edges of the main body 122 of the sidewall 120 protruding laterally beyond the base 121, the compressive stress film 124 is interrupted at the portions opposing the base 121 of the sidewall 120 or is made a thin film at these portions.

Thereafter, the interlayer insulating film 125 is laminated by CVD on the compressive stress film 124. Consequently, the semiconductor device 101 shown in FIG. 5 is obtained.

Figure 7:
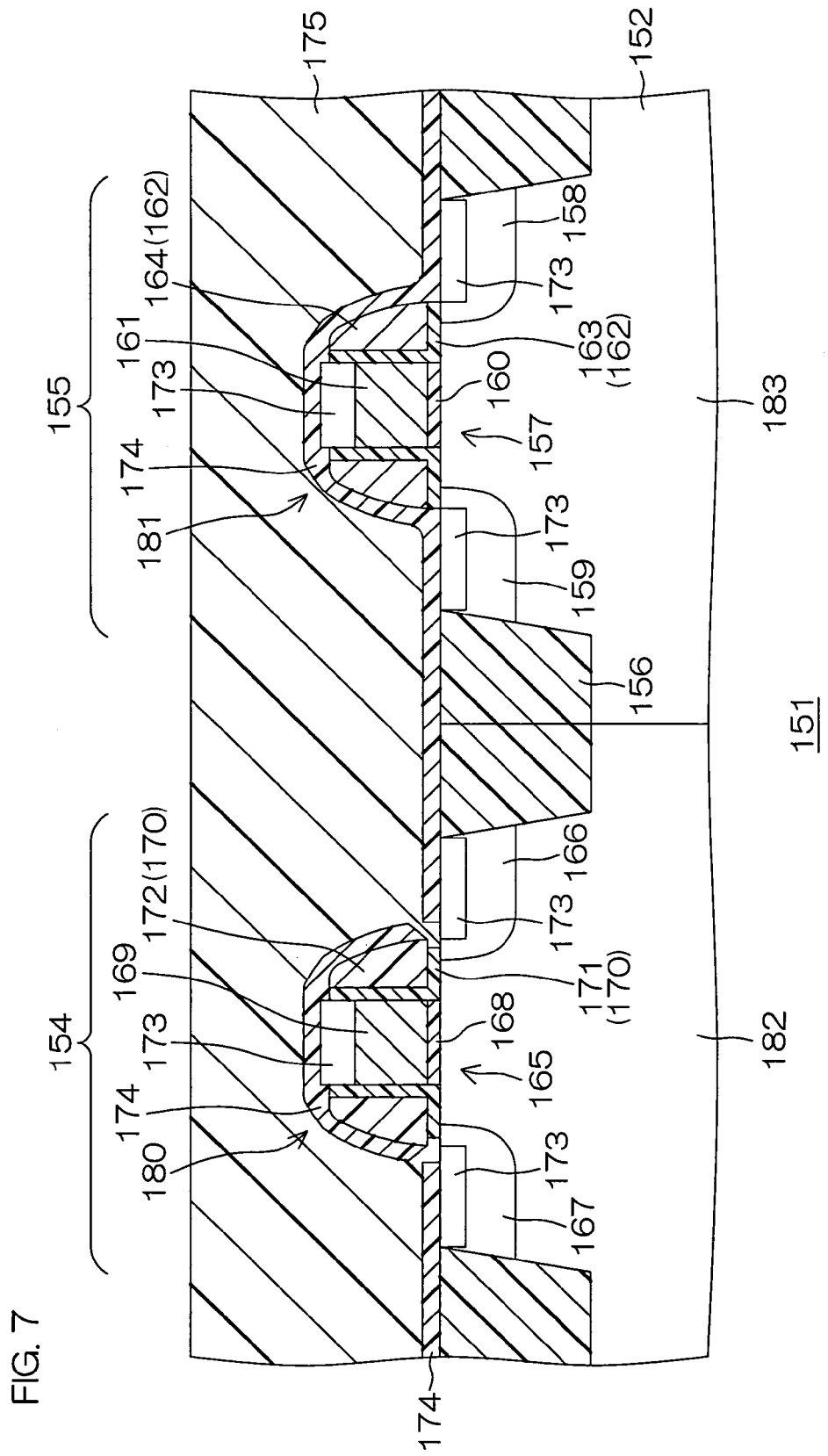
FIG. 7 is a schematic sectional view of a structure of a semiconductor device according to a fourth embodiment of the present invention.

FIG. 7 is a schematic sectional view of a structure of a semiconductor device according to a fourth embodiment of the present invention.

The semiconductor device 151 has a CMOS structure including a planar NMOSFET 180 and PMOSFET 181.

In the semiconductor device 151, a P⁻-type semiconductor layer 152 is laminated on an unillustrated semiconductor substrate.

An element separating portion 156 is formed in a top layer portion of the semiconductor layer 152. The element separating portion 156 rectangularly surrounds an NMOSFET forming region 154 in which the NMOSFET 180 is formed and a PMOSFET forming region 155 in which the PMOSFET 181 is formed. The element separating portion 156 has a structure where $SiO_2$ or other insulator is embedded in grooves dug in comparatively shallowly from a top surface of the semiconductor layer 152 (for example, shallow trenches of 0.2 to 0.5 μm depth). The NMOSFET forming region 154 and the PMOSFET forming region 155 are insultingly separated by the element separating portion 156.

An N well 183 is formed in a top layer portion of the semiconductor layer 152 in the PMOSFET forming region 155. In a top layer portion of the N well 183 (the top layer portion of the semiconductor layer 152 in the PMOSFET forming region 155), a P⁺-type source region 158 and a drain region 159 are formed across a channel region 157.

A gate insulating film 160 is formed as a first gate insulating film made of $SiO_2$ on the channel region 157. A gate electrode 161 is formed as a first gate electrode made of polysilicon on the gate insulating film 160.

A sidewall 162 is formed as a first sidewall at a periphery of the gate electrode 161. Side surfaces of the gate insulating film 160 and the gate electrode 161 are surrounded by the sidewall 162. The sidewall 162 includes a base 163, made of $SiO_2$, and a main body 164, made of SiN.

The base 163 has, for example, a film thickness of 5 to 10 nm and is formed to an L-like cross section in contact with the semiconductor layer 152, the gate insulating film 160, and the gate electrode 161.

The main body 164 is formed on the base 163, has a substantially triangular cross section, and opposes an entirety of the side surfaces of the gate electrode 161. Peripheral edges of the main body 164 and peripheral edges of the base 163 are overlapped.

A P well 182 is formed in a top layer portion of the semiconductor layer 152 in the NMOSFET forming region 154. In a top layer portion of the P well 182 (the top layer portion of the semiconductor layer 152 in the NMOSFET forming region 154), an N⁺-type source region 166 and a drain region 167 are formed across a channel region 165.

A gate insulating film 168 is formed as a second gate insulating film made of $SiO_2$ on the channel region 165. A gate electrode 169 is formed as a second gate electrode made of polysilicon on the gate insulating film 168.

A sidewall 170 is formed as a second sidewall at a periphery of the gate electrode 169. Side surfaces of the gate insulating film 168 and the gate electrode 169 are surrounded by the sidewall 170. The sidewall 170 includes a base 171, made of $SiO_2$, and a main body 172, made of SiN.

The base 171 has, for example, a film thickness of 5 to 10 nm and is formed to an L-like cross section in contact with the semiconductor layer 152, the gate insulating film 168, and the gate electrode 169.

The main body 172 is formed on the base 171, has a substantially triangular cross section, and opposes an entirety of the side surfaces of the gate electrode 169. Peripheral edges of the main body 172 protrude laterally beyond peripheral edges of the base 171.

Co silicide 173 for electrical connection is formed in respective surface layer portions of the source regions 158 and 166, the drain regions 159 and 167, the gate electrode 161, and the gate electrode 169.

A compressive stress film 174, made of SiN and in which is accumulated a compressive stress in a direction from an inner side to an outer side thereof, is formed on the semiconductor layer 152, the gate electrode 161, and the gate electrode 169. In the PMOSFET forming region 155, the compressive stress film 174 covers the semiconductor layer 152, the gate electrode 161, and the sidewall 162 continuously. In the NMOSFET forming region 154, the compressive stress film 174 covers the semiconductor layer 152, the gate electrode 169, and the sidewall 170. However, due to the peripheral edges of the main body 172 of the sidewall 170 protruding laterally beyond the base 171, the compressive stress film 174 is interrupted at portions opposing the base 171 of the sidewall 170 or is made a thin film at these portions.

An interlayer insulating film 175 made of $SiO_2$ is formed on the compressive stress film 174.

The base 171 of the sidewall 170 of the NMOSFET 180 is thus not covered by the compressive stress film 174 or even if covered, is not covered adequately. An adequate compressive stress in a direction of increasing an ON current of the PMOSFET 181 can thus be applied by the compressive stress film 174 to the channel region 157 of the PMOSFET 181 without applying a large compressive stress in a direction of decreasing an ON current of the NMOSFET 180 to the channel region 165 of the NMOSFET 180. Consequently, the compressive stress suited to the channel region 157 of the PMOSFET 181 can be applied without causing a significant increase in the number of manufacturing steps.

FIGS. 8A to 8J are schematic sectional views illustrating, in order of process, a method for manufacturing the semiconductor device shown in FIG. 7.

First, grooves corresponding to the element separating portion 156 are formed in a top layer portion of the semiconductor layer 152 by reactive ion etching. An $SiO_2$ film is then deposited by LPCVD on the semiconductor layer 152 to a thickness completely filling the respective grooves. Portions of the $SiO_2$ film extending outside the respective grooves are then selectively removed and by the $SiO_2$ film remaining only on the grooves, the element separating portion 156 is formed. Selective removal of the $SiO_2$ film can be achieved by CMP.

Thereafter, an $SiO_2$ film is formed on the semiconductor layer 152 by a thermal oxidation method. A polysilicon layer is then formed by CVD on the $SiO_2$ film. By the $SiO_2$ film and the polysilicon film then being selectively removed by photolithography and etching, the gate insulating film 160 and the gate electrode 161 are formed in the PMOSFET forming region 155 and the gate insulating film 168 and the gate electrode 169 are formed in the NMOSFET forming region 154 as shown in FIG. 8A.

Then, as shown in FIG. 8B, an oxide film 176 made of $SiO_2$ is formed by LPCVD on the semiconductor layer 152, the gate electrode 161, and the gate electrode 169.

Thereafter, a nitride film 177 made of SiN is formed by LPCVD on the oxide film 176 as shown in FIG. 8C.

Then, as shown in FIG. 8D, by the oxide film 176 and the nitride film 177 being etched back until upper surfaces of the gate electrode 161 and the gate electrode 169 are exposed, the sidewall 162 is formed at the periphery of the gate insulating film 160 and the gate electrode 161 and the sidewall 170 is formed at the periphery of the gate insulating film 168 and the gate electrode 169. At this point, the peripheral edges of the main body 164 of the sidewall 162 are overlapped with the peripheral edges of the base 163. The peripheral edges of the main body 172 of the sidewall 170 are overlapped with the peripheral edges of the base 171.

Thereafter, as shown in FIG. 8E, a resist pattern having an opening opposing the PMOSFET forming region 155 is formed on the semiconductor layer 152. A P-type impurity is implanted into a top layer portion of the semiconductor layer 152 via the opening of the resist pattern 178. After implantation of the P-type impurity, the resist pattern 178 is removed.

Then, as shown in FIG. 8F, a resist pattern 179 having an opening opposing the NMOSFET forming region 154 is formed on the semiconductor layer 152. An N-type impurity is implanted into a top layer portion of the semiconductor layer 152 via the opening of the resist pattern 179.

Figure 8G:
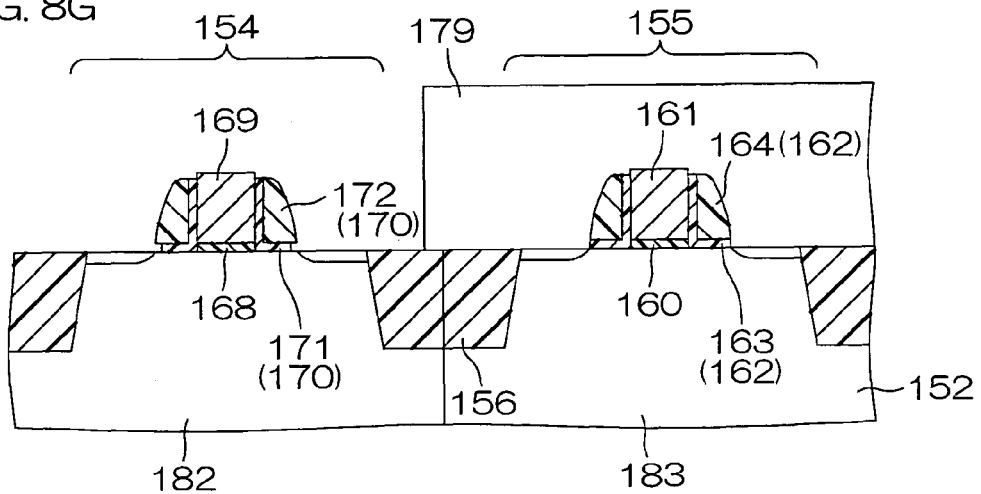
FIG. 8G is a schematic sectional view of a step subsequent to that of FIG. 8F.

Thereafter, as shown in FIG. 8G, peripheral edge portions of the base 171 of the sidewall 170 are removed by wet etching. That is, a solution capable of etching the base is supplied to the base 171 via the opening of the resist pattern 179 and portions of the base 171 sandwiched by peripheral edge portions of the main body 172 and the semiconductor layer are removed. Consequently, the peripheral edges of the main body 172 are shaped to protrude laterally with respect to the peripheral edges of the base 171. After the wet etching of the base 171, the resist pattern 179 is removed.

Figure 8H:
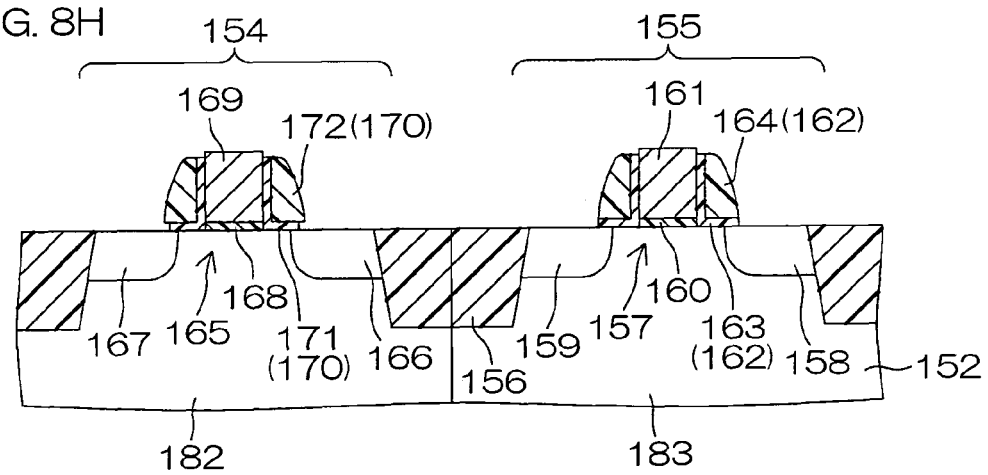
FIG. 8H is a schematic sectional view of a step subsequent to that of FIG. 8G.

An annealing treatment is then performed. The source region 158 and the drain region 159 are thereby formed in the top layer portion of the semiconductor layer 152 in the PMOSFET forming region 155 as shown in FIG. 8H. Further, the source region 166 and the drain region 167 are formed in the top layer portion of the semiconductor layer 152 in the NMOSFET forming region 154.

Figure 8I:
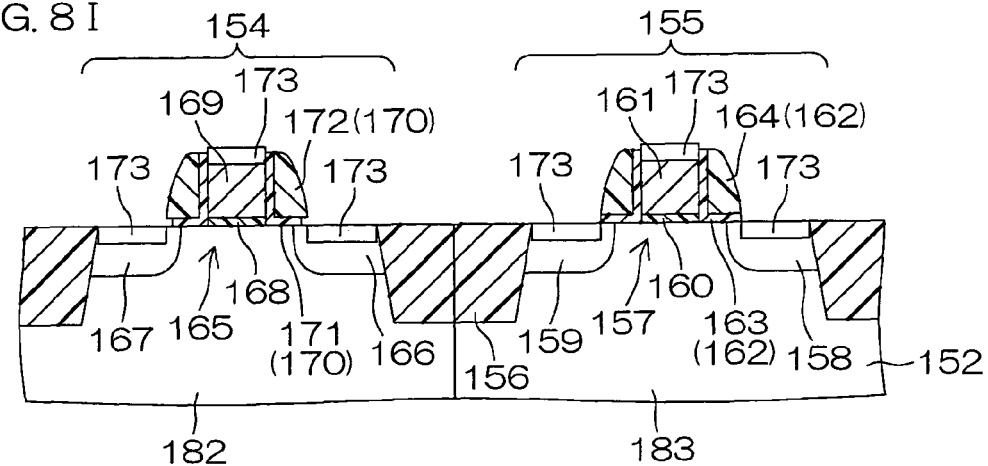
FIG. 8I is a schematic sectional view of a step subsequent to that of FIG. 8H.

Thereafter, as shown in FIG. 8I, a Co film (not shown) is formed by PVD on the source regions 158 and 166, the drain regions 159 and 167, the gate electrode 161, and the gate electrode 169. By an annealing treatment being performed thereafter, the Co silicide 173 for electrical connection (contact) is formed in the respective surface layer portions of the source regions 158 and 166, the drain regions 159 and 167, the gate electrode 161, and the gate electrode 169.

Figure 8J:
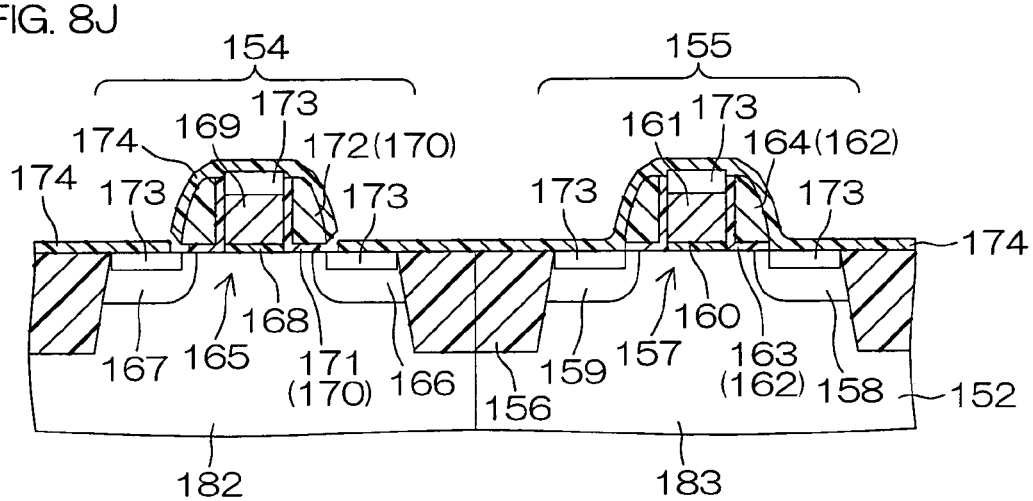
FIG. 8J is a schematic sectional view of a step subsequent to that of FIG. 8I.

Then, as shown in FIG. 8J, the compressive stress film 174 is formed by CVD on the semiconductor layer 152, the gate electrode 161, and the gate electrode 169. In the PMOSFET forming region 155, the compressive stress film 174 covers the semiconductor layer 152, the gate electrode 161, and the sidewall 162 continuously. In the NMOSFET forming region 154, the compressive stress film 174 covers the semiconductor layer 152, the gate electrode 169, and the sidewall 170. However, due to the peripheral edges of the main body 172 of the sidewall 170 protruding laterally beyond the base 171, the compressive stress film 174 is interrupted at the portions opposing the base 171 of the sidewall 170 or is made a thin film at these portions.

Thereafter, the interlayer insulating film 175 is laminated by CVD on the compressive stress film 174. Consequently, the semiconductor device 151 shown in FIG. 7 is obtained.

The compressive stress film 174 for applying the compressive stress in the direction from the inner side to the outer side thereof to the gate electrode 161 is formed on the semiconductor layer 152, the gate electrode 161, and the gate electrode 169 after the peripheral edges of the main body 172 of the sidewall 170 have been shaped to protrude laterally beyond the base 171 by the etching of the base 171 of the sidewall 170. The compressive stress film 174 is thus interrupted at the portions opposing the base 171 of the sidewall 170 or is made a thin film at these portions. Thus, an adequate compressive stress in the direction of increasing the ON current of the PMOSFET 181 can be applied by the compressive stress film 174 to the channel region 157 of the PMOSFET 181 without applying a large compressive stress in the direction of decreasing the ON current of the NMOSFET 180 to the channel region 165 of the NMOSFET 180. Consequently, the compressive stress can be applied to the channel region 157 of the PMOSFET 181 without causing a significant increase in the number of manufacturing steps.

Although four embodiments of the present invention were described above, the present invention can be carried out in yet other modes as well.

For example, a configuration may be employed where the conduction types of the respective semiconductor portions of the semiconductor device 51 shown in FIG. 3 are inverted. That is, in the semiconductor device 51, the P-type portions may be replaced by N-type portions and the N-type portions may be replaced by P-type portions. In this case, when in the step shown in FIG. 4H, a compressive stress film in which a compressive stress is accumulated is formed in place of the tensile stress film 80, an adequate compressive stress in the direction of increasing the ON current of the PMOSFET can be memorized in the channel region 65 of the PMOSFET without applying a large compressive stress in the direction of decreasing the ON current of the NMOSFET to the channel region 60 of the NMOSFET in the annealing treatment shown in FIG. 4I.

Further, a configuration may be employed where the conduction types of the respective semiconductor portions of the semiconductor device 101 shown in FIG. 5 are inverted and a tensile stress film in which a tensile stress is accumulated is formed in place of the compressive stress film 124. That is, in the semiconductor device 101, the P-type portions may be replaced by the N-type portions and the N-type portion may be replaced by P-type portions, and a tensile stress film, formed of SiN and in which is accumulated a tensile stress in a direction from an outer side to an inner side thereof, may be formed on the semiconductor layer 102, the gate electrode 111, and the gate electrode 119. An adequate tensile stress in the direction of increasing the ON current of the NMOSFET can thus be applied to the channel region 107 of the NMOSFET without applying a large tensile stress in the direction of decreasing the ON current of the PMOSFET to the channel region 115 of the PMOSFET. In this case, when in the step shown in FIG. 6H, a compressive stress film in which a compressive stress is accumulated is formed in place of the tensile stress film 130, an adequate compressive stress in the direction of increasing the ON current of the PMOSFET can be memorized in the channel region 115 of the PMOSFET without applying a large compressive stress in the direction of decreasing the ON current of the NMOSFET to the channel region 107 of the NMOSFET when the annealing treatment shown in FIG. 6I is performed.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2008-4606 filed with the Japan Patent Office on Jan. 11, 2008, the disclosure of which is incorporated herein by reference.

What is claimed is:

1. A semiconductor device comprising:
   a semiconductor layer;
   an element separating portion, formed in a top layer portion of the semiconductor layer and separating, in the semiconductor layer, a first element forming region for forming a first conductive type MOSFET and a second element forming region for forming a second conductive type MOSFET;
   a first gate insulating film, selectively formed on a top surface of the semiconductor layer in the first element forming region;
   a first gate electrode, formed on the first gate insulating film;
   a first sidewall, formed at a periphery of the first gate insulating film and the first gate electrode, the first sidewall including a base, contacting a top surface of the semiconductor layer, and a main body, formed on the base and expanded laterally beyond a peripheral edge of the base;
   a second gate insulating film, selectively formed on a top surface of the semiconductor layer in the second element forming region;
   a second gate electrode, formed on the second gate insulating film;
   a second sidewall, formed at a periphery of the second gate insulating film and the second gate electrode; and
   a tensile stress film for applying a tensile stress to a channel region in the top layer portion of the semiconductor layer opposing the second gate insulating film, the tensile stress film disposed on the semiconductor layer, the first gate electrode, and the second gate electrode, the tensile stress film being interrupted at a portion opposing the base of the first sidewall.

2. The semiconductor device according to claim 1, wherein the first conductive type is a P-type,
   the second conductive type is an N-type, and
   the tensile stress is applied to the channel region in the top layer portion of the semiconductor layer opposing the second gate insulating film.

3. A semiconductor device comprising:
   a semiconductor layer;
   an element separating portion, formed in a top layer portion of the semiconductor layer and separating, in the semiconductor layer, a first element forming region for forming a first conductive type MOSFET and a second element forming region for forming a second conductive type MOSFET;
   a first gate insulating film, selectively formed on a top surface of the semiconductor layer in the first element forming region;
   a first gate electrode, formed on the first gate insulating film;
   a first sidewall, formed at a periphery of the first gate insulating film and the first gate electrode, the first sidewall including a base, contacting a top surface of the semiconductor layer, and a main body, formed on the base and expanded laterally beyond a peripheral edge of the base;
   a second gate insulating film, selectively formed on a top surface of the semiconductor layer in the second element forming region;
   a second gate electrode, formed on the second gate insulating film;
   a second sidewall, formed at a periphery of the second gate insulating film and the second gate electrode; and
   a compressive stress film for applying a compressive stress to a channel region in the top layer portion of the semiconductor layer opposing the second gate insulating film, the compressive stress film disposed on the semiconductor layer, the first gate electrode, and the second gate electrode, the compressive stress film being interrupted at a portion opposing the base of the first sidewall.

4. The semiconductor device according to claim 3, wherein the first conductive type is an N-type,
   the second conductive type is a P-type, and
   the compressive stress is applied to the channel region in the top layer portion of the semiconductor layer opposing the second gate insulating film.

5. The semiconductor device according to claim 4, wherein a tensile stress is applied to a channel region in the top layer portion of the semiconductor layer opposing the first gate insulating film.

6. A method for manufacturing a semiconductor device comprising a PMOSFET and an NMOSFET, the method comprising the steps of:
   forming a first gate insulating film and a first gate electrode, laminated on the first gate insulating film, on a top surface of a semiconductor layer in a first element forming region in which the PMOSFET is to be formed;
   forming a second gate insulating film and a second gate electrode, laminated on the second gate insulating film, on a top surface of the semiconductor layer in a second element forming region in which the NMOSFET is to be formed;
   forming an oxide film on the semiconductor layer, the first gate electrode, and the second gate electrode;
   forming a nitride film on the oxide film;
   etching back the oxide film and the nitride film to form a first sidewall comprising a base, made of the oxide film, and a main body, made of the nitride film, at a periphery of the first gate insulating film and the first gate electrode and form a second sidewall comprising a base, made of the oxide film, and a main body, made of the nitride film, at a periphery of the second gate insulating film and the second gate electrode;

etching the base of the first sidewall to form the first sidewall to a shape where a peripheral edge of the main body is expanded laterally beyond a peripheral edge of the base of the first sidewall; and forming, on the semiconductor layer, the first gate electrode, and the second gate electrode, a tensile stress film for applying a tensile stress to a channel region in a top layer portion of the semiconductor layer opposing the second gate insulating film such that the tensile stress film is interrupted at a portion opposing the base of the first sidewall.

7. The method for manufacturing semiconductor device according to claim 6 further comprising the step of:
performing a heat treatment after the step of forming the tensile stress film.

8. A method for manufacturing a semiconductor device comprising a NMOSFET and an PMOSFET, the method comprising the steps of:

forming a first gate insulating film and a first gate electrode, laminated on the first gate insulating film, on a top surface of a semiconductor layer in a first element forming region in which the NMOSFET is to be formed;

forming a second gate insulating film and a second gate electrode, laminated on the second gate insulating film, on a top surface of the semiconductor layer in a second element forming region in which the PMOSFET is to be formed;

forming an oxide film on the semiconductor layer, the first gate electrode, and the second gate electrode;

forming a nitride film on the oxide film;

etching back the oxide film and the nitride film to form a first sidewall comprising a base, made of the oxide film, and a main body, made of the nitride film, at a periphery of the first gate insulating film and the first gate electrode and form a second sidewall comprising a base, made of the oxide film, and a main body, made of the nitride film, at a periphery of the second gate insulating film and the second gate electrode;

etching the base of the first sidewall to form the first sidewall to a shape where a peripheral edge of the main body protrudes laterally beyond a peripheral edge of the base of the first sidewall; and forming, on the semiconductor layer, the first gate electrode, and the second gate electrode, a compressive stress film for applying a compressive stress to a channel region in a top layer portion of the semiconductor layer opposing the second gate insulating film such that the compressive stress film is interrupted at a portion opposing the base of the first sidewall.

9. A semiconductor device comprising:
a semiconductor layer;
an element separating portion, formed in a top layer portion of the semiconductor layer and separating, in the semiconductor layer, a first element forming region for forming a first conductive type MOSFET and a second element forming region for forming a second conductive type MOSFET;
a first gate insulating film, selectively formed on a top surface of the semiconductor layer in the first element forming region;
a first gate electrode, formed on the first gate insulating film;
a first sidewall, formed at a periphery of the first gate insulating film and the first gate electrode, the first sidewall including a base, contacting a top surface of the semiconductor layer, and a main body formed on the base and expanded laterally beyond a peripheral edge of the base;
a second gate insulating film, selectively formed on a top surface of the semiconductor layer in the second element forming region;
a second gate electrode, formed on the second gate insulating film;
a second sidewall, formed at a periphery of the second gate insulating film and the second gate electrode; and
a tensile stress film for applying a tensile stress to a channel region in the top layer portion of the semiconductor layer opposing the second gate insulating film, the tensile stress film disposed on the semiconductor layer, the first gate electrode, and the second gate electrode, the tensile stress film forming a thin film at a portion opposing the base of the first sidewall.

10. The semiconductor device according to claim 9, wherein
the first conductive type is a P-type,
the second conductive type is an N-type, and
the tensile stress is applied to a channel region in the top layer portion of the semiconductor layer opposing the second gate insulating film.

11. A semiconductor device comprising:
a semiconductor layer;
an element separating portion, formed in a top layer portion of the semiconductor layer and separating, in the semiconductor layer, a first element forming region for forming a first conductive type MOSFET and a second element forming region for forming a second conductive type MOSFET;
a first gate insulating film, selectively formed on a top surface of the semiconductor layer in the first element forming region;
a first gate electrode, formed on the first gate insulating film;
a first sidewall, formed at a periphery of the first gate insulating film and the first gate electrode, the first sidewall including a base, contacting a top surface of the semiconductor layer, and a main body, formed on the base and expanded laterally beyond a peripheral edge of the base;
a second gate insulating film, selectively formed on a top surface of the semiconductor layer in the second element forming region;
a second gate electrode, formed on the second gate insulating film;
a second sidewall, formed at a periphery of the second gate insulating film and the second gate electrode; and
a compressive stress film for applying a compressive stress to a channel region in the top layer portion of the semiconductor layer opposing the second gate insulating film, the compressive stress film being disposed on the semiconductor layer, the first gate electrode, and the second gate electrode, the compressive stress film further forming a thin film at a portion opposing the base of the first sidewall.

12. The semiconductor device according to claim 11, wherein
the first conductive type is an N-type,
the second conductive type is a P-type, and the compressive stress is applied to a channel region in the top layer portion of the semiconductor layer opposing the second gate insulating film.

13. The semiconductor device according to claim 12, wherein a tensile stress is applied to a channel region in a top layer portion of the semiconductor layer opposing the first gate insulating film.

14. A method for manufacturing a semiconductor device comprising a PMOSFET and an NMOSFET, the method comprising the steps of:
    forming a first gate insulating film and a first gate electrode, laminated on the first gate insulating film, on a top surface of a semiconductor layer in a first element forming region in which the PMOSFET is to be formed;
    forming a second gate insulating film and a second gate electrode, laminated on the second gate insulating film, on a top surface of the semiconductor layer in a second element forming region in which the NMOSFET is to be formed;
    forming an oxide film on the semiconductor layer, the first gate electrode, and the second gate electrode;
    forming a nitride film on the oxide film;
    etching back the oxide film and the nitride film to form a first sidewall comprising a base, made of the oxide film, and a main body, made of the nitride film, at a periphery of the first gate insulating film and the first gate electrode and further forming a second sidewall comprising a base, made of the oxide film, and a main body, made of the nitride film, at a periphery of the second gate insulating film and the second gate electrode;
    etching the base of the first sidewall to form the first sidewall to a shape where a peripheral edge of the main body is expanded laterally beyond a peripheral edge of the base of the first sidewall; and
    forming, on the semiconductor layer, the first gate electrode, and the second gate electrode, a tensile stress film for applying a tensile stress to a channel region in a top layer portion of the semiconductor layer opposing the second gate insulating film such that the tensile stress film forms a thin film at a portion opposing the base of the first sidewall.

15. The method for manufacturing semiconductor device according to claim 14 further comprising the step of performing a heat treatment after the step of forming the tensile stress film.

16. The method for manufacturing semiconductor device according to claim 14 further wherein the tensile stress film decreases in thickness at the portion opposing the base of the first sidewall.

17. A method for manufacturing a semiconductor device comprising a NMOSFET and a PMOSFET, the method comprising the steps of:
    forming a first gate insulating film and a first gate electrode, laminated on the first gate insulating film, on a top surface of a semiconductor layer in a first element forming region in which the NMOSFET is to be formed;
    forming a second gate insulating film and a second gate electrode, laminated on the second gate insulating film, on a top surface of the semiconductor layer in a second element forming region in which the PMOSFET is to be formed;
    forming an oxide film on the semiconductor layer, the first gate electrode, and the second gate electrode;
    forming a nitride film on the oxide film;
    etching back the oxide film and the nitride film to form a first sidewall comprising a base, made of the oxide film, and a main body, made of the nitride film, at a periphery of the first gate insulating film and the first gate electrode and further forming a second sidewall comprising a base, made of the oxide film, and a main body, made of the nitride film, at a periphery of the second gate insulating film and the second gate electrode;
    etching the base of the first sidewall to form the first sidewall to a shape where a peripheral edge of the main body protrudes laterally beyond a peripheral edge of the base of the first sidewall; and
    forming, on the semiconductor layer, the first gate electrode, and the second gate electrode, a compressive stress film for applying a compressive stress to a channel region in a top layer portion of the semiconductor layer opposing the second gate insulating film such that the compressive stress film forms a thin film at a portion opposing the base of the first sidewall.

18. The method for manufacturing semiconductor device according to claim 17, wherein the compressive stress film decreases in thickness at the portion opposing the base of the first sidewall.

* * * * *